US009160276B1

(12) United States Patent
Franco et al.

(10) Patent No.: US 9,160,276 B1
(45) Date of Patent: *Oct. 13, 2015

(54) ADAPTIVE IMPEDANCE TRANSLATION CIRCUIT

(71) Applicant: RF Micro Devices, Inc., Greensboro, NC (US)

(72) Inventors: Marcelo J. Franco, Summerfield, NC (US); David C. Dening, Stokesdale, NC (US); Robert J. Baeten, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 325 days.

This patent is subject to a terminal disclaimer.

(21) Appl. No.: 13/875,797

(22) Filed: May 2, 2013

Related U.S. Application Data

(63) Continuation of application No. 12/498,084, filed on Jul. 6, 2009, now Pat. No. 8,472,910.

(60) Provisional application No. 61/078,108, filed on Jul. 3, 2008.

(51) Int. Cl.
*H04B 1/26* (2006.01)
*H03D 9/06* (2006.01)

(52) U.S. Cl.
CPC ..................................... *H03D 9/06* (2013.01)

(58) Field of Classification Search
USPC .......................................................... 455/323
See application file for complete search history.

(56) References Cited

U.S. PATENT DOCUMENTS

| 4,030,017 | A | * | 6/1977 | Brown ............................. 363/45 |
| 4,045,741 | A | * | 8/1977 | Missale ...................... 455/166.2 |
| 4,564,843 | A | * | 1/1986 | Cooper ......................... 343/745 |
| 4,564,853 | A | | 1/1986 | Egan |
| 5,281,932 | A | * | 1/1994 | Even-Or ......................... 333/32 |
| 5,977,850 | A | * | 11/1999 | Chaturvedi ................... 333/238 |
| 5,986,617 | A | * | 11/1999 | McLellan ..................... 343/860 |
| 7,123,087 | B2 | * | 10/2006 | Ohnishi et al. ................ 330/126 |
| 7,453,321 | B2 | * | 11/2008 | Itkin et al. ..................... 330/302 |

(Continued)

OTHER PUBLICATIONS

De Graauw, A.J.M. et al., "MEMS-Based Reconfigurable Multi-Band BiCMOS Power Amplifier," Bipolar/BICMOS Circuits and Technology Meeting, 2006, pp. 1-4.

(Continued)

*Primary Examiner* — Ankur Jain
(74) *Attorney, Agent, or Firm* — Withrow & Terranova, P.L.L.C.

(57) ABSTRACT

The present invention relates to an adaptable RF impedance translation circuit that includes a first group of inductive elements cascaded in series between an input and an output without any series switching elements, a second group of inductive elements cascaded in series, and a group of switching elements that are capable of electrically coupling the first group of inductive elements to the second group of inductive elements. Further, the adaptable RF impedance translation circuit includes at least one variable shunt capacitance circuit electrically coupled between a common reference and at least one connection node in the adaptable RF impedance translation circuit, which includes control circuitry to select either an OFF state or an ON state associated with each of the switching elements and to select a capacitance associated with each variable shunt capacitance circuit to control impedance translation characteristics of the adaptable RF impedance translation circuit.

19 Claims, 18 Drawing Sheets

(56) References Cited

U.S. PATENT DOCUMENTS

| | | | |
|---|---|---|---|
| 2004/0100341 A1* | 5/2004 | Luetzelschwab et al. | 333/32 |
| 2005/0059362 A1* | 3/2005 | Kalajo et al. | 455/127.1 |
| 2005/0104680 A1* | 5/2005 | Katta | 333/32 |
| 2005/0233764 A1* | 10/2005 | Solski et al. | 455/552.1 |
| 2005/0270105 A1* | 12/2005 | Van Bezooijen et al. | 330/297 |
| 2006/0012512 A1* | 1/2006 | Jirskog | 342/124 |
| 2008/0136729 A1* | 6/2008 | Kang et al. | 343/861 |
| 2008/0238569 A1* | 10/2008 | Matsuo | 333/32 |
| 2009/0176467 A1* | 7/2009 | Im et al. | 455/182.1 |
| 2010/0159864 A1* | 6/2010 | Rofougaran | 455/248.1 |

OTHER PUBLICATIONS

Van Bezooijen, Andre et al., "RF-MEMS Based Adaptive Antenna Matching Module," 2007 IEEE Radio Frequency Integrated Circuits Symposium, 2007, pp. 573-576.

Non-Final Office Action for U.S. Appl. No. 12/498,084, mailed Feb. 29, 2012, 21 pages.

Final Office Action for U.S. Appl. No. 12/498,084, mailed Jul. 26, 2012, 23 pages.

Advisory Action for U.S Appl. No. 12/498,084, mailed Sep. 4, 2012, 3 pages.

Notice of Allowance for U.S. Appl. No. 12/498,084, mailed Feb. 27, 2013, 16 pages.

* cited by examiner

ADAPTIVE IMPEDANCE TRANSLATION CIRCUIT

This application claims priority to U.S. patent application Ser. No. 12/498,084 filed on Jul. 6, 2009, entitled "Adaptive Impedance Translation Circuit," now U.S. Pat. No. 8,472,910, which is incorporated herein by reference in its entirety. The '084 application also claims the benefit of provisional patent application Ser. No. 61/078,108, filed Jul. 3, 2008, the disclosure of which is hereby incorporated herein by reference in its entirety.

FIELD OF THE INVENTION

Embodiments of the present invention relate to impedance translation circuits, which may be used in radio frequency (RF) communications systems.

BACKGROUND OF THE INVENTION

As wireless communications devices become increasingly ubiquitous, support of multiple communications protocols is often required. As a result, many wireless communications devices are multi-mode devices, which are capable of operating using two or more RF communications bands, which may have frequency ranges that are widely separated from one another, are capable of operating in a half-duplex or a full-duplex operating mode, may operate over a wide range of output power levels, may use multiple modulation techniques, or any combination thereof. To enable high levels of integration, the wireless communications devices may need to be physically small. Therefore, sharing as many components as possible when operating in different modes is desirable. For example, use of a common power amplifier, a common antenna, or both may be desirable to reduce size, cost, or both. However, one or more adaptive RF impedance translation circuits may be needed to properly interface a common power amplifier to an RF antenna over all operating conditions.

One or more adaptive RF impedance translation circuits may be needed to properly interface an RF antenna to receive circuitry, to a common power amplifier, or the like over all operating conditions. Specifically, in a portable wireless communications device, an RF antenna may undergo large loading changes that are dependent upon nearby physical conditions, such as proximity to a user's body, proximity to metallic objects, or the like. Such loading changes may cause large changes in a voltage standing wave ratio (VSWR) associated with large impedance changes of the RF antenna. By coupling an adaptive RF impedance translation circuit to the RF antenna it may be possible to compensate for VSWR changes and present an impedance to other circuitry that has reduced impedance fluctuations. Additionally, portable wireless communications devices are often battery powered. To conserve power, any adaptive RF impedance translation circuits may need low insertion loss to reduce power consumption.

Thus, there is a need for an adaptive RF impedance translation circuit that can operate over at least two communications bands having frequency ranges that are widely separated from one another, has low insertion loss, is physically small, can operate efficiently over a wide power range, and has a wide impedance adjustment range.

SUMMARY OF THE EMBODIMENTS

The present invention relates to an adaptable RF impedance translation circuit that includes a first group of inductive elements cascaded in series between an input and an output without any series switching elements, a second group of inductive elements cascaded in series, and a group of switching elements that are capable of electrically coupling the first group of inductive elements to the second group of inductive elements. Further, the adaptable RF impedance translation circuit includes at least one variable shunt capacitance circuit electrically coupled between a common reference and at least one connection node in the adaptable RF impedance translation circuit, which includes control circuitry to select either an OFF state or an ON state associated with each of the switching elements and to select a capacitance associated with each variable shunt capacitance circuit. By controlling the switching elements and each variable shunt capacitance circuit, the control circuitry controls impedance translation characteristics of the adaptable RF impedance translation circuit.

Since the first group of series cascaded inductive elements does not include any series switching elements, insertion losses associated with series switching elements may be minimized. By selecting the appropriate combination of OFF states, ON states, or both, numerous circuit topologies may be configured. For example, several different variants of L networks, T networks, and Pi networks are possible alone, or in combination. By combining a selection of circuit topologies with selecting desired capacitances using variable shunt capacitance circuits, a broad range of impedance translation characteristics may be available. Therefore, a wide impedance adjustment range, a wide operating frequency range enabling multi-mode operation, and small physical size enabling integration may be possible.

Alternate embodiments of the adaptable RF impedance translation circuit may include any number of groups of series cascaded inductive elements, such that each group of series cascaded inductive elements may include any number of inductive elements. The adaptable RF impedance translation circuit may include any number of switching elements coupled between the groups of series cascaded inductive elements and any number of variable shunt capacitance circuits electrically coupled between the common reference and the connection nodes. A variable shunt capacitance circuit may be electrically coupled between the common reference and the input. Similarly, a variable shunt capacitance circuit may be electrically coupled between the common reference and the output. The common reference may be ground.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

Figure 1:
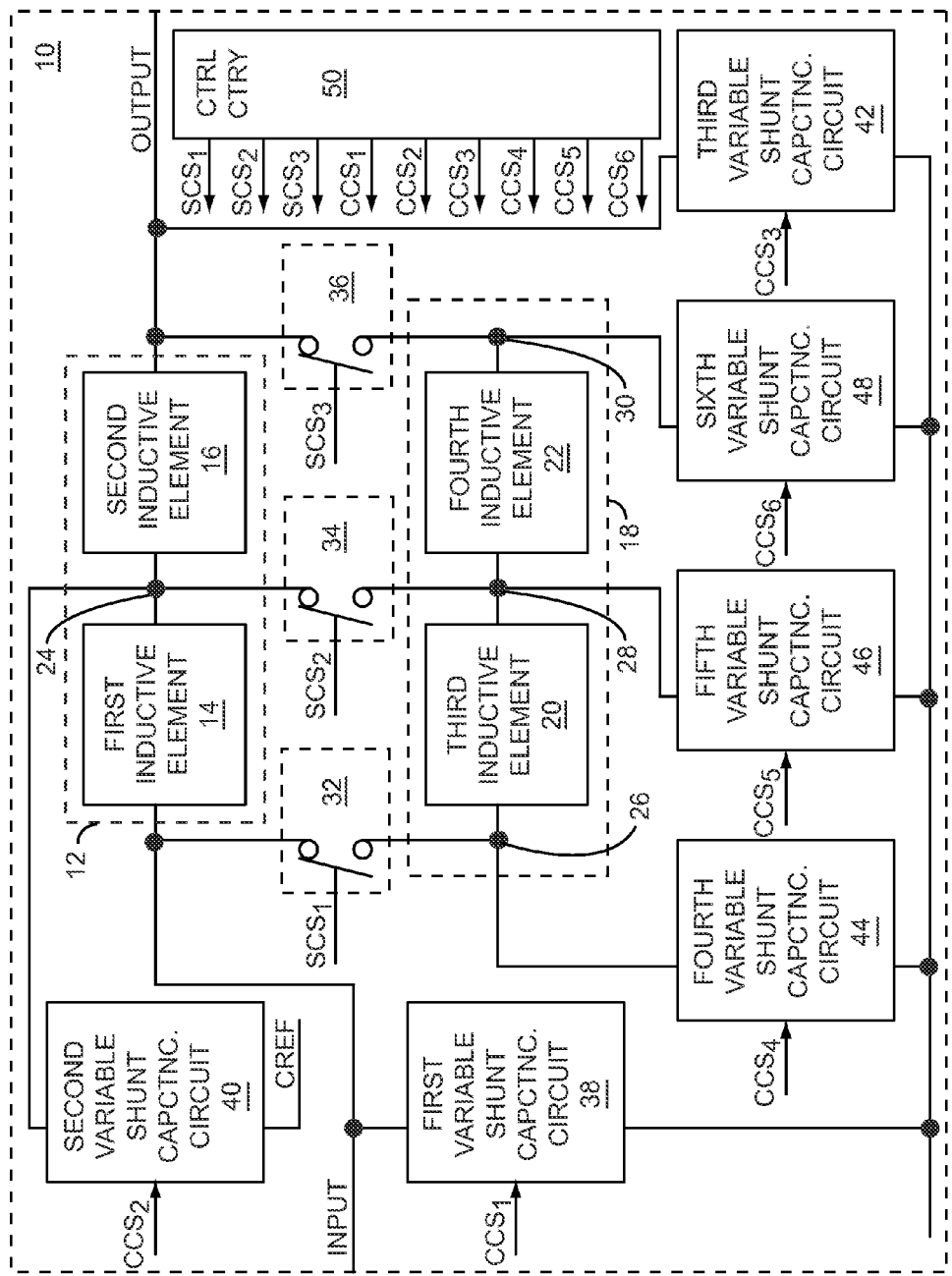
FIG. 1 shows a first RF impedance translation circuit according to one embodiment of the first RF impedance translation circuit.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to an adaptable RF impedance translation circuit that includes a first group of inductive elements cascaded in series between an input and an output without any series switching elements, a second group of inductive elements cascaded in series, and a group of switching elements that are capable of electrically coupling the first group of inductive elements to the second group of inductive elements. Further, the adaptable RF impedance translation circuit includes at least one variable shunt capacitance circuit electrically coupled between a common reference and at least one connection node in the adaptable RF impedance translation circuit, which includes control circuitry to select either an OFF state or an ON state associated with each of the switching elements and to select a capacitance associated with each variable shunt capacitance circuit. By controlling the switching elements and each variable shunt capacitance circuit, the control circuitry controls impedance translation characteristics of the adaptable RF impedance translation circuit.

Since the first group of series cascaded inductive elements does not include any series switching elements, insertion losses associated with series switching elements may be minimized. By selecting the appropriate combination of OFF states, ON states, or both, numerous circuit topologies may be configured. For example, several different variants of L networks, T networks, and Pi networks are possible alone or in combination. By combining a selection of circuit topologies with selecting desired capacitances using variable shunt capacitance circuits, a broad range of impedance translation characteristics may be available. Therefore, a wide impedance adjustment range, a wide operating frequency range enabling multi-mode operation, and small physical size enabling integration may be possible.

Alternate embodiments of the adaptable RF impedance translation circuit may include any number of groups of series cascaded inductive elements, such that each group of series cascaded inductive elements may include any number of inductive elements. The adaptable RF impedance translation circuit may include any number of switching elements coupled between the groups of series cascaded inductive elements and any number of variable shunt capacitance circuits electrically coupled between the common reference and the connection nodes. A variable shunt capacitance circuit may be electrically coupled between the common reference and the input. Similarly, a variable shunt capacitance circuit may be electrically coupled between the common reference and the output. The common reference may be ground.

FIG. 1 shows a first RF impedance translation circuit 10 according to one embodiment of the first RF impedance translation circuit 10. The first RF impedance translation circuit 10 includes a first group 12 of inductive elements, which includes a first inductive element 14 and a second inductive element 16, and a second group 18 of inductive elements, which includes a third inductive element 20 and a fourth inductive element 22. The first group 12 of inductive elements is cascaded in series between an input INPUT and an output OUTPUT using a first connection node 24, such that the first inductive element 14 is electrically coupled between the input INPUT and the first connection node 24, and the second inductive element 16 is electrically coupled between the output OUTPUT and the first connection node 24. The second group 18 of inductive elements is cascaded in series using multiple connection nodes, such that the third inductive element 20 is electrically coupled between a second connection node 26 and a third connection node 28, and the fourth inductive element 22 is electrically coupled between a fourth connection node 30 and the third connection node 28.

The first RF impedance translation circuit 10 includes a group of switching elements that are capable of electrically coupling the first group 12 of inductive elements to the second group 18 of inductive elements. Specifically, a first switching element 32 is electrically coupled between the second connection node 26 and the input INPUT, a second switching element 34 is electrically coupled between the first connection node 24 and the third connection node 28, and a third switching element 36 is electrically coupled between the fourth connection node 30 and the output OUTPUT.

Further, the first RF impedance translation circuit 10 includes at least one variable shunt capacitance circuit electrically coupled between a common reference CREF and at least one connection node in the first RF impedance translation circuit 10. Specifically, the first RF impedance translation circuit 10 includes a first variable shunt capacitance circuit 38 electrically coupled between the common reference CREF and the input INPUT, a second variable shunt capacitance circuit 40 electrically coupled between the common reference CREF and the first connection node 24, a third variable shunt capacitance circuit 42 electrically coupled between the common reference CREF and the output OUTPUT, a fourth variable shunt capacitance circuit 44 electrically coupled between the common reference CREF and the second connection node 26, a fifth variable shunt capacitance circuit 46 electrically coupled between the common reference CREF and the third connection node 28, and a sixth variable shunt capacitance circuit 48 electrically coupled between the common reference CREF and the fourth connection node 30.

Additionally, the first RF impedance translation circuit 10 includes control circuitry 50, which provides a first switch control signal $SCS_1$ to the first switching element 32, a second switch control signal $SCS_2$ to the second switching element 34, a third switch control signal $SCS_3$ to the third switching element 36, a first capacitance control signal $CCS_1$ to the first variable shunt capacitance circuit 38, a second capacitance control signal $CCS_2$ to the second variable shunt capacitance circuit 40, a third capacitance control signal $CCS_3$ to the third variable shunt capacitance circuit 42, a fourth capacitance control signal $CCS_4$ to the fourth variable shunt capacitance circuit 44, a fifth capacitance control signal $CCS_6$ to the fifth variable shunt capacitance circuit 46, and a sixth capacitance control signal $CCS_6$ to the sixth variable shunt capacitance circuit 48.

By providing the appropriate first switch control signal $SCS_1$, second switch control signal $SCS_2$, and third switch control signal $SCS_3$, the control circuitry 50 may select either an OFF state or an ON state associated with each of the first switching element 32, the second switching element 34, and the third switching element 36, respectively. When each ON state is selected, the first switching element 32 electrically couples the second connection node 26 to the input INPUT, the second switching element 34 electrically couples the first connection node 24 to the third connection node 28, and the third switching element 36 electrically couples the fourth connection node 30 to the output OUTPUT. When each OFF state is selected, the first switching element 32 does not intentionally provide a conduction path between the second connection node 26 and the input INPUT, the second switching element 34 does not intentionally provide a conduction path between the first connection node 24 and the third connection node 28, and the third switching element 36 does not intentionally provide a conduction path between the fourth connection node 30 and the output OUTPUT.

By providing the appropriate first capacitance control signal $CCS_1$, second capacitance control signal $CCS_2$, third capacitance control signal $CCS_3$, fourth capacitance control signal $CCS_4$, fifth capacitance control signal $CCS_5$, and sixth capacitance control signal $CCS_6$, the control circuitry 50 may select a desired capacitance associated with each of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, and the sixth variable shunt capacitance circuit 48, respectively. The first variable shunt capacitance circuit 38 presents a selected capacitance between the common reference CREF and the input INPUT, the second variable shunt capacitance circuit 40 presents a selected capacitance between the common reference CREF and the first connection node 24, the third variable shunt capacitance circuit 42 presents a selected capacitance between the common reference CREF and the output OUTPUT, the fourth variable shunt capacitance circuit 44 presents a selected capacitance between the common reference CREF and the second connection node 26, the fifth variable shunt capacitance circuit 46 presents a selected capacitance between the common reference CREF and the third connection node 28, and the sixth variable shunt capacitance circuit 48 presents a selected capacitance between the common reference CREF and the fourth connection node 30.

A first impedance presented to the output OUTPUT may be translated into a second impedance presented at the input INPUT based on the selected capacitances associated with each of the first, the second, the third, the fourth, the fifth, and the sixth variable shunt capacitance circuits 38, 40, 42, 44, 46, 48 and the switching states of the first, the second, and the third switching elements 32, 34, 36. Further, impedance translation characteristics of the first RF impedance translation circuit 10 may be based on the selected capacitances associated with each of the first, the second, the third, the fourth, the fifth, and the sixth variable shunt capacitance circuits 38, 40, 42, 44, 46, 48 and the switching states of the first, the second, and the third switching elements 32, 34, 36. In general, the impedance translation characteristics of the first RF impedance translation circuit 10 may be based on each capacitance control signal and on each switch control signal, and the first impedance presented to the output OUTPUT may be translated into the second impedance presented at the input INPUT based on each capacitance control signal and on each switch control signal.

In a first exemplary embodiment of the first RF impedance translation circuit 10 illustrated in FIG. 1, one of the first switching element 32, the second switching element 34, and the third switching element 36, and a corresponding one of the first switch control signal $SCS_1$, the second switch control signal $SCS_2$, and the third switch control signal $SCS_3$ are omitted.

In a second exemplary embodiment of the first RF impedance translation circuit 10 illustrated in FIG. 1, one of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, and the sixth variable shunt capacitance circuit 48, and a corresponding one of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, and the sixth capacitance control signal $CCS_6$ are omitted.

In a third exemplary embodiment of the first RF impedance translation circuit 10 illustrated in FIG. 1, two of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, and the sixth variable shunt capacitance circuit 48, and a corresponding two of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, and the sixth capacitance control signal $CCS_6$ are omitted.

In a fourth exemplary embodiment of the first RF impedance translation circuit 10 illustrated in FIG. 1, three of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, and the sixth variable shunt capacitance circuit 48, and a corresponding three of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, and the sixth capacitance control signal $CCS_6$ are omitted.

In a fifth exemplary embodiment of the first RF impedance translation circuit 10 illustrated in FIG. 1, four of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, and the sixth variable shunt capacitance circuit 48, and a corresponding four of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, and the sixth capacitance control signal $CCS_6$ are omitted.

In a sixth exemplary embodiment of the first RF impedance translation circuit 10 illustrated in FIG. 1, five of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, and the sixth variable shunt capacitance circuit 48, and a corresponding five of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, and the sixth capacitance control signal $CCS_6$ are omitted. In one embodiment of the first RF impedance translation circuit 10 illustrated in FIG. 1, the common reference CREF is ground.

Figure 2:
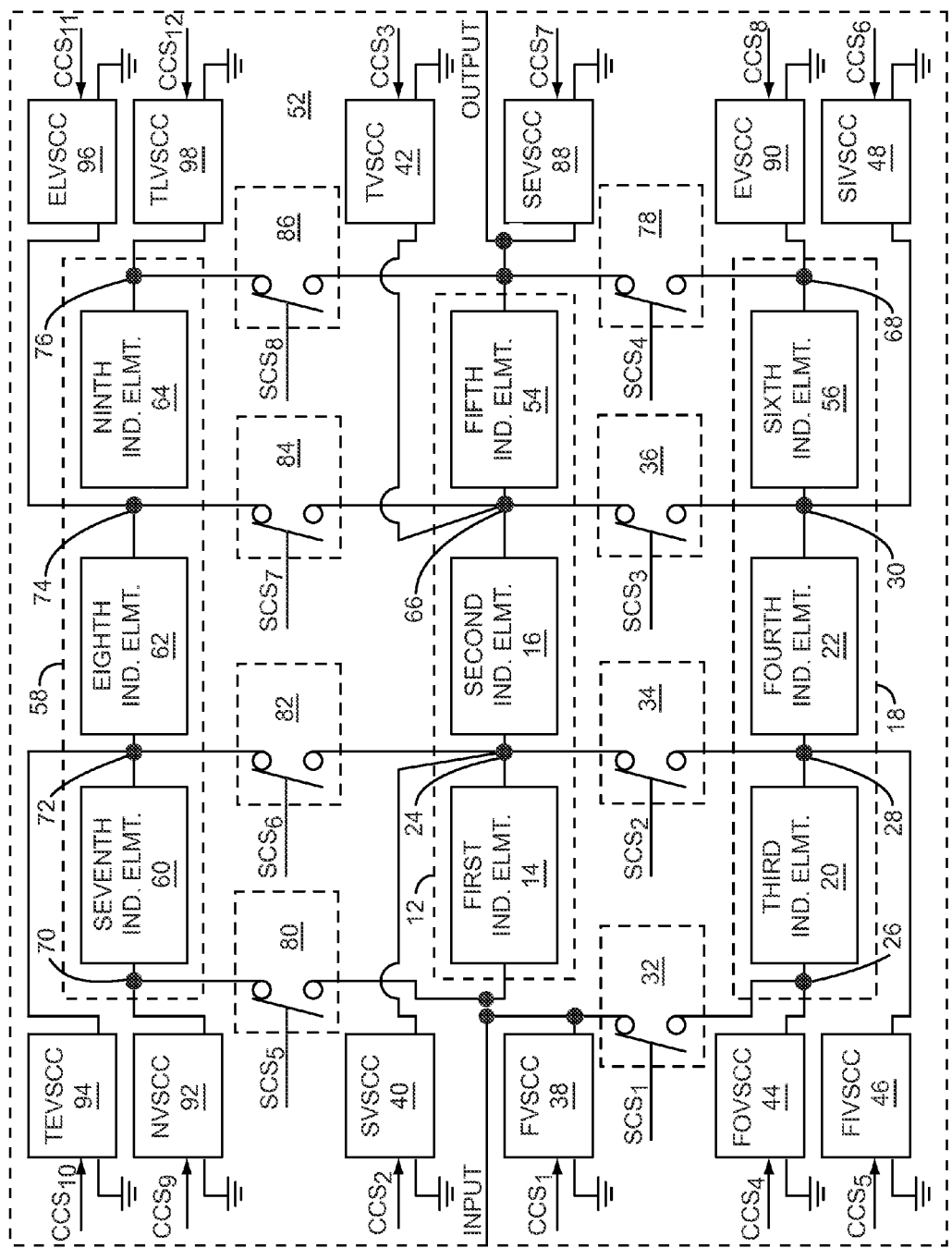
FIG. 2 shows a first portion of the first RF impedance translation circuit according to an alternate embodiment of the first RF impedance translation circuit.

FIG. 2 shows a first portion 52 of the first RF impedance translation circuit 10 according to an alternate embodiment of the first RF impedance translation circuit 10. The first RF impedance translation circuit 10 includes the first group 12 of inductive elements, which includes the first inductive element 14, the second inductive element 16, and a fifth inductive element 54, the second group 18 of inductive elements, which includes the third inductive element 20, the fourth inductive element 22, and a sixth inductive element 56, and a third group 58 of inductive elements, which includes a seventh inductive element 60, an eighth inductive element 62, and a ninth inductive element 64.

The first group 12 of inductive elements is cascaded in series between the input INPUT and the output OUTPUT using the first connection node 24 and a fifth connection node 66, such that the first inductive element 14 is electrically coupled between the input INPUT and the first connection node 24, the second inductive element 16 is electrically coupled between the first connection node 24 and the fifth connection node 66, and the fifth inductive element 54 is electrically coupled between the fifth connection node 66 and the output OUTPUT. The second group 18 of inductive elements is cascaded in series using multiple connection nodes, such that the third inductive element 20 is electrically coupled between the second connection node 26 and the third connection node 28, the fourth inductive element 22 is electrically coupled between the third connection node 28 and the fourth connection node 30, and the sixth inductive element 56 is electrically coupled between the fourth connection node 30 and a sixth connection node 68. The third group 58 of inductive elements is cascaded in series using multiple connection nodes, such that the seventh inductive element 60 is electrically coupled between a seventh connection node 70 and an eighth connection node 72, the eighth inductive element 62 is electrically coupled between the eighth connection node 72 and a ninth connection node 74, and the ninth inductive element 64 is electrically coupled between the ninth connection node 74 and a tenth connection node 76.

The first RF impedance translation circuit 10 includes the group of switching elements that are capable of electrically coupling the first group 12 of inductive elements to the second group 18 of inductive elements and the first group 12 of inductive elements to the third group 58 of inductive elements. Specifically, the first switching element 32 is electrically coupled between the second connection node 26 and the input INPUT, the second switching element 34 is electrically coupled between the third connection node 28 and the first connection node 24, the third switching element 36 is electrically coupled between the fourth connection node 30 and the fifth connection node 66, a fourth switching element 78 is electrically coupled between the sixth connection node 68 and the output OUTPUT, a fifth switching element 80 is electrically coupled between the input INPUT and the seventh connection node 70, a sixth switching element 82 is electrically coupled between the first connection node 24 and the eighth connection node 72, a seventh switching element 84 is electrically coupled between the fifth connection node 66 and the ninth connection node 74, and an eighth switching element 86 is electrically coupled between the output OUTPUT and the tenth connection node 76.

The first RF impedance translation circuit 10 includes multiple variable shunt capacitance circuits electrically coupled between ground and multiple connection nodes in the first RF impedance translation circuit 10. Specifically, the first RF impedance translation circuit 10 includes the first variable shunt capacitance circuit 38 electrically coupled between ground and the input INPUT, the second variable shunt capacitance circuit 40 electrically coupled between ground and the first connection node 24, the third variable shunt capacitance circuit 42 electrically coupled between ground and the fifth connection node 66, the fourth variable shunt capacitance circuit 44 electrically coupled between ground and the second connection node 26, the fifth variable shunt capacitance circuit 46 electrically coupled between ground and the third connection node 28, and the sixth variable shunt capacitance circuit 48 electrically coupled between ground and the fourth connection node 30.

Further, the first RF impedance translation circuit 10 includes a seventh variable shunt capacitance circuit 88 electrically coupled between ground and the output OUTPUT, an eighth variable shunt capacitance circuit 90 electrically coupled between ground and the sixth connection node 68, a ninth variable shunt capacitance circuit 92 electrically coupled between ground and the seventh connection node 70, a tenth variable shunt capacitance circuit 94 electrically coupled between ground and the eighth connection node 72, an eleventh variable shunt capacitance circuit 96 electrically coupled between ground and the ninth connection node 74, and a twelfth variable shunt capacitance circuit 98 electrically coupled between ground and the tenth connection node 76.

Additionally, the first RF impedance translation circuit 10 includes control circuitry 50 (not shown), which provides the first switch control signal $SCS_1$ to the first switching element 32, the second switch control signal $SCS_2$ to the second switching element 34, the third switch control signal $SCS_3$ to the third switching element 36, a fourth switch control signal $SCS_4$ to the fourth switching element 78, a fifth switch control signal $SCS_5$ to the fifth switching element 80, a sixth switch control signal $SCS_6$ to the sixth switching element 82, a seventh switch control signal $SCS_7$ to the seventh switching element 84, and an eighth switch control signal $SCS_8$ to the eighth switching element 86.

In addition, the control circuitry 50 (not shown) provides the first capacitance control signal $CCS_1$ to the first variable shunt capacitance circuit 38, the second capacitance control signal $CCS_2$ to the second variable shunt capacitance circuit 40, the third capacitance control signal $CCS_3$ to the third variable shunt capacitance circuit 42, the fourth capacitance control signal $CCS_4$ to the fourth variable shunt capacitance circuit 44, the fifth capacitance control signal $CCS_5$ to the fifth variable shunt capacitance circuit 46, the sixth capacitance control signal $CCS_6$ to the sixth variable shunt capacitance circuit 48, a seventh capacitance control signal $CCS_7$ to the seventh variable shunt capacitance circuit 88, an eighth capacitance control signal $CCS_8$ to the eighth variable shunt capacitance circuit 90, a ninth capacitance control signal $CCS_9$ to the ninth variable shunt capacitance circuit 92, a tenth capacitance control signal $CCS_{10}$ to the tenth variable shunt capacitance circuit 94, an eleventh capacitance control signal $CCS_{11}$ to the eleventh variable shunt capacitance circuit 96, and a twelfth capacitance control signal $CCS_{12}$ to the twelfth variable shunt capacitance circuit 98.

By providing the appropriate first, second, third, fourth, fifth, sixth, seventh, and eighth switch control signals $SCS_1$, $SCS_2$, $SCS_3$, $SCS_4$, $SCS_5$, $SCS_6$, $SCS_7$, $SCS_8$, the control circuitry 50 (not shown) may select either an OFF state or an ON state associated with each of the first, the second, the third, the fourth, the fifth, the sixth, the seventh, and the eighth switching elements 32, 34, 36, 78, 80, 82, 84, 86, respectively. When each ON state is selected, the first switching element 32 electrically couples the second connection node 26 to the input INPUT, the second switching element 34 electrically couples the third connection node 28 to the first connection node 24, the third switching element 36 electrically couples the fourth connection node 30 to the fifth connection node 66, the fourth switching element 78 electrically couples the sixth connection node 68 to the output OUTPUT, the fifth switching element 80 electrically couples the input INPUT to the seventh connection node 70, the sixth switching element 82 electrically couples the first connection node 24 to the eighth connection node 72, the seventh switching element 84 electrically couples the fifth connection node 66 to the ninth connection node 74, and the eighth switching element 86 electrically couples the output OUTPUT to the tenth connection node 76.

When each OFF state is selected, the first switching element 32 does not intentionally provide a conduction path between the second connection node 26 and the input INPUT, the second switching element 34 does not intentionally provide a conduction path between the first connection node 24 and the third connection node 28, the third switching element 36 does not intentionally provide a conduction path between the fourth connection node 30 and the fifth connection node 66, the fourth switching element 78 does not intentionally provide a conduction path between the sixth connection node 68 and the output OUTPUT, the fifth switching element 80 does not intentionally provide a conduction path between the input INPUT and the seventh connection node 70, the sixth switching element 82 does not intentionally provide a conduction path between the first connection node 24 and the eighth connection node 72, the seventh switching element 84 does not intentionally provide a conduction path between the fifth connection node 66 and the ninth connection node 74, and the eighth switching element 86 does not intentionally provide a conduction path between the output OUTPUT and the tenth connection node 76.

By providing the appropriate first, second, third, fourth, fifth, sixth, seventh, eighth, ninth, tenth, eleventh, and twelfth capacitance control signals $CCS_1$, $CCS_2$, $CCS_3$, $CCS_4$, $CCS_5$, $CCS_6$, $CCS_7$, $CCS_8$, $CCS_9$, $CCS_{10}$, $CCS_{11}$, $CCS_{12}$, the control circuitry 50 (not shown) may select a desired capacitance associated with each of the first, the second, the third, the fourth, the fifth, the sixth, the seventh, the eighth, the ninth, the tenth, the eleventh, and the twelfth variable shunt capacitance circuits 38, 40, 42, 44, 46, 48, 88, 90, 92, 94, 96, 98, respectively. The first variable shunt capacitance circuit 38 presents a selected capacitance between ground and the input INPUT, the second variable shunt capacitance circuit 40 presents a selected capacitance between ground and the first connection node 24, the third variable shunt capacitance circuit 42 presents a selected capacitance between ground and the fifth connection node 66, the fourth variable shunt capacitance circuit 44 presents a selected capacitance between ground and the second connection node 26, the fifth variable shunt capacitance circuit 46 presents a selected capacitance between ground and the third connection node 28, the sixth variable shunt capacitance circuit 48 presents a selected capacitance between ground and the fourth connection node 30, the seventh variable shunt capacitance circuit 88 presents a selected capacitance between ground and the output OUTPUT, the eighth variable shunt capacitance circuit 90 presents a selected capacitance between ground and the sixth connection node 68, the ninth variable shunt capacitance circuit 92 presents a selected capacitance between ground and the seventh connection node 70, the tenth variable shunt capacitance circuit 94 presents a selected capacitance between ground and the eighth connection node 72, the eleventh variable shunt capacitance circuit 96 presents a selected capacitance between ground and the ninth connection node 74, and the twelfth variable shunt capacitance circuit 98 presents a selected capacitance between ground and the tenth connection node 76.

In a first exemplary embodiment of the first RF impedance translation circuit 10 illustrated in FIG. 2, one of the first switching element 32, the second switching element 34, the third switching element 36, the fourth switching element 78, the fifth switching element 80, the sixth switching element 82, the seventh switching element 84, and the eighth switching element 86, and a corresponding one of the first switch control signal $SCS_1$, the second switch control signal $SCS_2$, the third switch control signal $SCS_3$, the fourth switch control signal $SCS_4$, the fifth switch control signal $SCS_5$, the sixth switch control signal $SCS_6$, the seventh switch control signal $SCS_7$, and the eighth switch control signal $SCS_8$, are omitted.

In a second exemplary embodiment of the first RF impedance translation circuit 10 illustrated in FIG. 2, two of the first switching element 32, the second switching element 34, the third switching element 36, the fourth switching element 78, the fifth switching element 80, the sixth switching element 82, the seventh switching element 84, and the eighth switching element 86, and a corresponding two of the first switch control signal $SCS_1$, the second switch control signal $SCS_2$, the third switch control signal $SCS_3$, the fourth switch control signal $SCS_4$, the fifth switch control signal $SCS_5$, the sixth switch control signal $SCS_6$, the seventh switch control signal $SCS_7$, and the eighth switch control signal $SCS_8$, are omitted.

In a third exemplary embodiment of the first RF impedance translation circuit 10 illustrated in FIG. 2, three of the first switching element 32, the second switching element 34, the third switching element 36, the fourth switching element 78, the fifth switching element 80, the sixth switching element 82, the seventh switching element 84, and the eighth switching element 86, and a corresponding three of the first switch control signal $SCS_1$, the second switch control signal $SCS_2$, the third switch control signal $SCS_3$, the fourth switch control signal $SCS_4$, the fifth switch control signal $SCS_5$, the sixth switch control signal $SCS_6$, the seventh switch control signal $SCS_7$, and the eighth switch control signal $SCS_8$, are omitted.

In a fourth exemplary embodiment of the first RF impedance translation circuit 10 illustrated in FIG. 2, four of the first switching element 32, the second switching element 34, the third switching element 36, the fourth switching element 78, the fifth switching element 80, the sixth switching element 82, the seventh switching element 84, and the eighth switching element 86, and a corresponding four of the first switch control signal $SCS_1$, the second switch control signal $SCS_2$, the third switch control signal $SCS_3$, the fourth switch control signal $SCS_4$, the fifth switch control signal $SCS_5$, the sixth switch control signal $SCS_6$, the seventh switch control signal $SCS_7$, and the eighth switch control signal $SCS_8$, are omitted.

In a fifth exemplary embodiment of the first RF impedance translation circuit 10 illustrated in FIG. 2, one of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, the sixth variable shunt capacitance circuit 48, the seventh variable shunt capacitance circuit 88, the eighth variable shunt capacitance circuit 90, the ninth variable shunt capacitance circuit 92, the tenth variable shunt capacitance circuit 94, the eleventh variable shunt capacitance circuit 96, and the twelfth variable shunt capacitance circuit 98, and a corresponding one of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, the sixth capacitance control signal $CCS_6$, the seventh capacitance control signal $CCS_7$, the eighth capacitance control signal $CCS_8$, the ninth capacitance control signal $CCS_9$, the tenth capacitance control signal $CCS_{10}$, the eleventh capacitance control signal $CCS_{11}$, and the twelfth capacitance control signal $CCS_{12}$, are omitted.

In a sixth exemplary embodiment of the first RF impedance translation circuit 10 illustrated in FIG. 2, two of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, the sixth variable shunt capacitance circuit 48, the seventh variable shunt capacitance circuit 88, the eighth variable shunt capacitance circuit 90, the ninth variable shunt capacitance circuit 92, the tenth variable shunt capacitance circuit 94, the eleventh variable shunt capacitance circuit 96, and the twelfth variable shunt capacitance circuit 98, and a corresponding two of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, the sixth capacitance control signal $CCS_6$, the seventh capacitance control signal $CCS_7$, the eighth capacitance control signal $CCS_8$, the ninth capacitance control signal $CCS_9$, the tenth capacitance control signal $CCS_{10}$, the eleventh capacitance control signal $CCS_{11}$, and the twelfth capacitance control signal $CCS_{12}$, are omitted.

In a seventh exemplary embodiment of the first RF impedance translation circuit 10 illustrated in FIG. 2, three of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, the sixth variable shunt capacitance circuit 48, the seventh variable shunt capacitance circuit 88, the eighth variable shunt capacitance circuit 90, the ninth variable shunt capacitance circuit 92, the tenth variable shunt capacitance circuit 94, the eleventh variable shunt capacitance circuit 96, and the twelfth variable shunt capacitance circuit 98, and a corresponding three of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, the sixth capacitance control signal $CCS_6$, the seventh capacitance control signal $CCS_7$, the eighth capacitance control signal $CCS_8$, the ninth capacitance control signal $CCS_9$, the tenth capacitance control signal $CCS_{10}$, the eleventh capacitance control signal $CCS_{11}$, and the twelfth capacitance control signal $CCS_{12}$, are omitted.

In an eighth exemplary embodiment of the first RF impedance translation circuit 10 illustrated in FIG. 2, four of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, the sixth variable shunt capacitance circuit 48, the seventh variable shunt capacitance circuit 88, the eighth variable shunt capacitance circuit 90, the ninth variable shunt capacitance circuit 92, the tenth variable shunt capacitance circuit 94, the eleventh variable shunt capacitance circuit 96, and the twelfth variable shunt capacitance circuit 98, and a corresponding four of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, the sixth capacitance control signal $CCS_6$, the seventh capacitance control signal $CCS_7$, the eighth capacitance control signal $CCS_8$, the ninth capacitance control signal $CCS_9$, the tenth capacitance control signal $CCS_{10}$, the eleventh capacitance control signal $CCS_{11}$, and the twelfth capacitance control signal $CCS_{12}$, are omitted.

In a ninth exemplary embodiment of the first RF impedance translation circuit 10 illustrated in FIG. 2, five of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, the sixth variable shunt capacitance circuit 48, the seventh variable shunt capacitance circuit 88, the eighth variable shunt capacitance circuit 90, the ninth variable shunt capacitance circuit 92, the tenth variable shunt capacitance circuit 94, the eleventh variable shunt capacitance circuit 96, and the twelfth variable shunt capacitance circuit 98, and a corresponding five of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, the sixth capacitance control signal $CCS_6$, the seventh capacitance control signal $CCS_7$, the eighth capacitance control signal $CCS_8$, the ninth capacitance control signal $CCS_9$, the tenth capacitance control signal $CCS_{10}$, the eleventh capacitance control signal $CCS_{11}$, and the twelfth capacitance control signal $CCS_{12}$, are omitted.

In a tenth exemplary embodiment of the first RF impedance translation circuit 10 illustrated in FIG. 2, six of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, the sixth variable shunt capacitance circuit 48, the seventh variable shunt capacitance circuit 88, the eighth variable shunt capacitance circuit 90, the ninth variable shunt capacitance circuit 92, the tenth variable shunt capacitance circuit 94, the eleventh variable shunt capacitance circuit 96, and the twelfth variable shunt capacitance circuit 98, and a corresponding six of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, the sixth capacitance control signal $CCS_6$, the seventh capacitance control signal $CCS_7$, the eighth capacitance control signal $CCS_8$, the ninth capacitance control signal $CCS_9$, the tenth capacitance control signal $CCS_{10}$, the eleventh capacitance control signal $CCS_{11}$, and the twelfth capacitance control signal $CCS_{12}$, are omitted.

In an eleventh exemplary embodiment of the first RF impedance translation circuit 10 illustrated in FIG. 2, seven of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, the sixth variable shunt capacitance circuit 48, the seventh variable shunt capacitance circuit 88, the eighth variable shunt capacitance circuit 90, the ninth variable shunt capacitance circuit 92, the tenth variable shunt capacitance circuit 94, the eleventh variable shunt capacitance circuit 96, and the twelfth variable shunt capacitance circuit 98, and a corresponding seven of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, the sixth capacitance control signal $CCS_6$, the seventh capacitance control signal $CCS_7$, the eighth capacitance control signal $CCS_8$, the ninth capacitance control signal $CCS_9$, the tenth capacitance control signal $CCS_{10}$, the eleventh capacitance control signal $CCS_{11}$, and the twelfth capacitance control signal $CCS_{12}$, are omitted.

In a twelfth exemplary embodiment of the first RF impedance translation circuit 10 illustrated in FIG. 2, eight of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, the sixth variable shunt capacitance circuit 48, the seventh variable shunt capacitance circuit 88, the eighth variable shunt capacitance circuit 90, the ninth variable shunt capacitance circuit 92, the tenth variable shunt capacitance circuit 94, the eleventh variable shunt capacitance circuit 96, and the twelfth variable shunt capacitance circuit 98, and a corresponding eight of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, the sixth capacitance control signal $CCS_6$, the seventh capacitance control signal $CCS_7$, the eighth capacitance control signal $CCS_8$, the ninth capacitance control signal $CCS_9$, the tenth capacitance control signal $CCS_{10}$, the eleventh capacitance control signal $CCS_{11}$, and the twelfth capacitance control signal $CCS_{12}$, are omitted.

In a thirteenth exemplary embodiment of the first RF impedance translation circuit 10 illustrated in FIG. 2, nine of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, the sixth variable shunt capacitance circuit 48, the seventh variable shunt capacitance circuit 88, the eighth variable shunt capacitance circuit 90, the ninth variable shunt capacitance circuit 92, the tenth variable shunt capacitance circuit 94, the eleventh variable shunt capacitance circuit 96, and the twelfth variable shunt capacitance circuit 98, and a corresponding nine of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, the sixth capacitance control signal $CCS_6$, the seventh capacitance control signal $CCS_7$, the eighth capacitance control signal $CCS_8$, the ninth capacitance control signal $CCS_9$, the tenth capacitance control signal $CCS_{10}$, the eleventh capacitance control signal $CCS_{11}$, and the twelfth capacitance control signal $CCS_{12}$, are omitted.

In an alternate embodiment of the first RF impedance translation circuit 10 illustrated in FIG. 2, the common reference CREF is used instead of ground.

Figure 3:
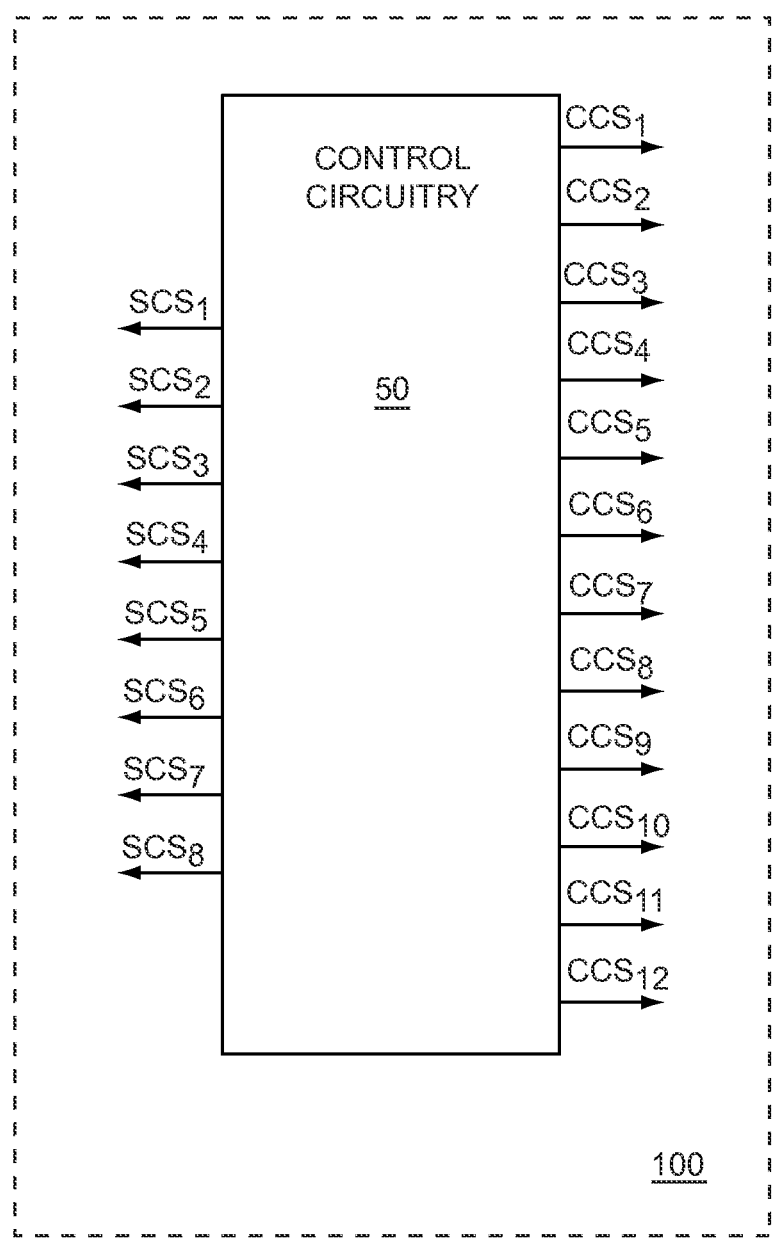
FIG. 3 shows a second portion of the first RF impedance translation circuit illustrated in FIG. 2.

FIG. 3 shows a second portion 100 of the first RF impedance translation circuit 10 illustrated in FIG. 2. The second portion 100 of the first RF impedance translation circuit 10 includes the control circuitry 50, which provides the first, second, third, fourth, fifth, sixth, seventh, and eighth switch control signals $SCS_1$, $SCS_2$, $SCS_3$, $SCS_4$, $SCS_5$, $SCS_6$, $SCS_7$, $SCS_8$ and the first, second, third, fourth, fifth, sixth, seventh, eighth, ninth, tenth, eleventh, and twelfth capacitance control signals $CCS_1$, $CCS_2$, $CCS_3$, $CCS_4$, $CCS_5$, $CCS_6$, $CCS_7$, $CCS_8$, $CCS_9$, $CCS_{10}$, $CCS_{11}$, $CCS_{12}$.

Figure 4:
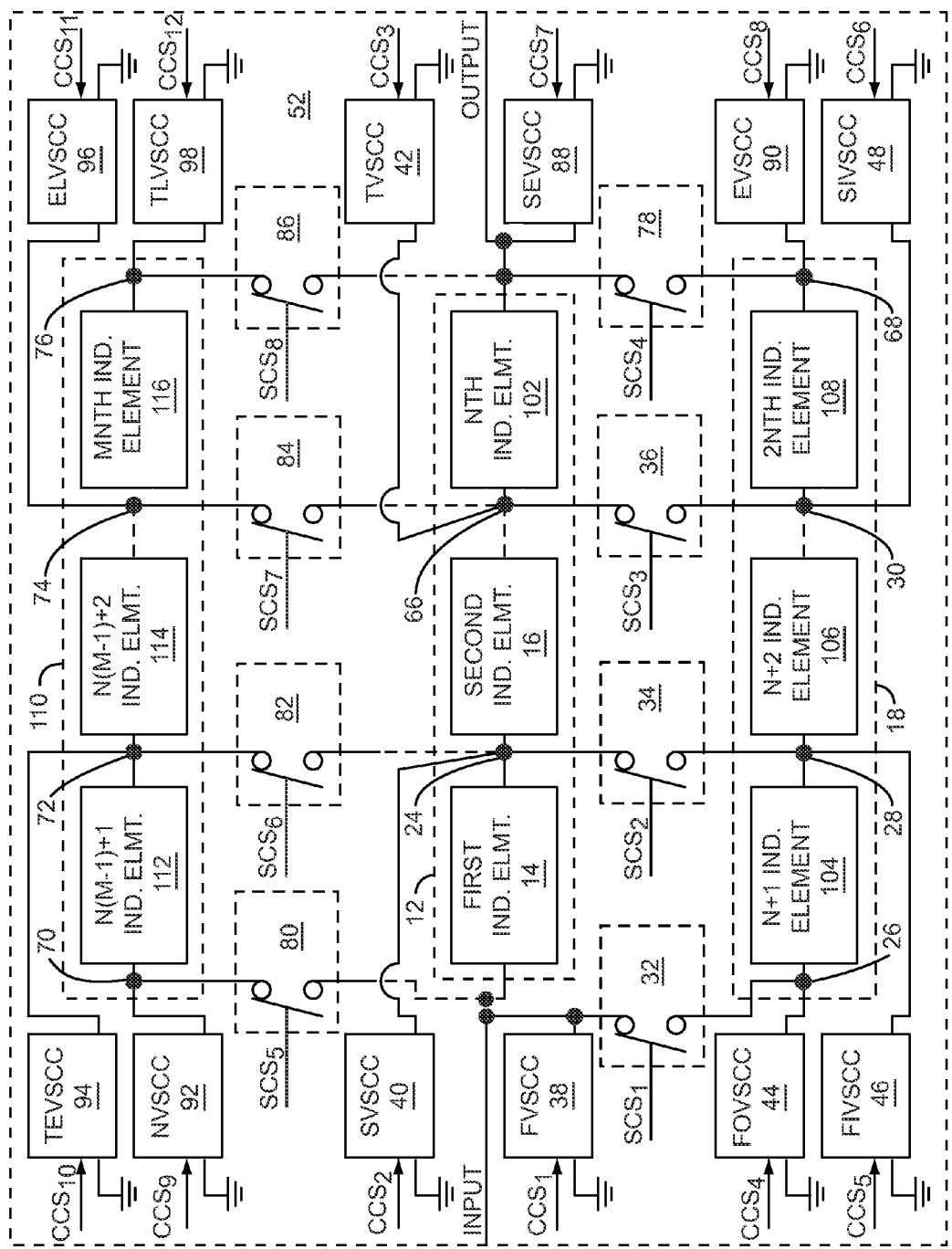
FIG. 4 shows the first portion of the first RF impedance translation circuit according to an additional embodiment of the first RF impedance translation circuit.

FIG. 4 shows the first portion 52 of the first RF impedance translation circuit 10 according to an additional embodiment of the first RF impedance translation circuit 10. The first RF impedance translation circuit 10 includes the first group 12 of inductive elements, which includes the first inductive element 14, the second inductive element 16, and up to and including an Nth inductive element 102, the second group 18 of inductive elements, which includes an N+1 inductive element 104, an N+2 inductive element 106, and up to and including a 2Nth inductive element 108, and up to and including an Mth group 110 of inductive elements, which includes an N(M−1)+1 inductive element 112, an N(M−1)+2 inductive element 114, and up to and including an MNth inductive element 116.

The first group 12 of inductive elements is cascaded in series between the input INPUT and the output OUTPUT using the first connection node 24, the fifth connection node 66, and additional connection nodes as needed, such that the first inductive element 14 is electrically coupled between the input INPUT and the first connection node 24, the second inductive element 16 is electrically coupled between the first connection node 24 and another connection node (not shown), and the Nth inductive element 102 is electrically coupled between the fifth connection node 66 and the output OUTPUT. The second group 18 of inductive elements is cascaded in series using multiple connection nodes, such that the N+1 inductive element 104 is electrically coupled between the second connection node 26 and the third connection node 28, the N+2 inductive element 106 is electrically coupled between the third connection node 28 and another connection node (not shown), and the 2Nth inductive element 108 is electrically coupled between the fourth connection node 30 and the sixth connection node 68. The Mth group 110 of inductive elements is cascaded in series using multiple connection nodes, such that the N(M−1)+1 inductive element 112 is electrically coupled between the seventh connection node 70 and the eighth connection node 72, the N(M−1)+2 inductive element 114 is electrically coupled between the eighth connection node 72 and another connection node (not shown), and the MNth inductive element 116 is electrically coupled between the ninth connection node 74 and the tenth connection node 76.

The first RF impedance translation circuit 10 includes the group of switching elements that are capable of electrically coupling the first group 12 of inductive elements to the second group 18 of inductive elements and the first group 12 of inductive elements up to and including the Mth group 110 of inductive elements. The first group 12 may be electrically coupled to each of the groups of inductive elements up to and including the Mth group 110 of inductive elements either directly or indirectly using at least one other group of inductive elements. Specifically, the first switching element 32 is electrically coupled between the second connection node 26 and the input INPUT, the second switching element 34 is electrically coupled between the third connection node 28 and the first connection node 24, the third switching element 36 is electrically coupled between the fourth connection node 30 and the fifth connection node 66, the fourth switching element 78 is electrically coupled between the sixth connection node 68 and the output OUTPUT, the fifth switching element 80 is electrically coupled between the input INPUT and the seventh connection node 70, the sixth switching element 82 is electrically coupled between the first connection node 24 and the eighth connection node 72, the seventh switching element 84 is electrically coupled between the fifth connection node 66 and the ninth connection node 74, and the eighth switching element 86 is electrically coupled between the output OUTPUT and the tenth connection node 76. Additional switching elements (not shown) may be added as needed.

The first RF impedance translation circuit 10 includes multiple variable shunt capacitance circuits electrically coupled between ground and multiple connection nodes in the first RF impedance translation circuit 10. Specifically, the first RF impedance translation circuit 10 includes the first variable shunt capacitance circuit 38 electrically coupled between ground and the input INPUT, the second variable shunt capacitance circuit 40 electrically coupled between ground and the first connection node 24, the third variable shunt capacitance circuit 42 electrically coupled between ground and the fifth connection node 66, the fourth variable shunt capacitance circuit 44 electrically coupled between ground and the second connection node 26, the fifth variable shunt capacitance circuit 46 electrically coupled between ground and the third connection node 28, and the sixth variable shunt capacitance circuit 48 electrically coupled between ground and the fourth connection node 30.

Further, the first RF impedance translation circuit 10 includes the seventh variable shunt capacitance circuit 88 electrically coupled between ground and the output OUTPUT, the eighth variable shunt capacitance circuit 90 electrically coupled between ground and the sixth connection node 68, the ninth variable shunt capacitance circuit 92 electrically coupled between ground and the seventh connection node 70, the tenth variable shunt capacitance circuit 94 electrically coupled between ground and the eighth connection node 72, the eleventh variable shunt capacitance circuit 96 electrically coupled between ground and the ninth connection node 74, and the twelfth variable shunt capacitance circuit 98 electrically coupled between ground and the tenth connection node 76. Additional variable shunt capacitance circuits (not shown) may be added as needed.

Additionally, the first RF impedance translation circuit 10 includes the control circuitry 50 (not shown), which provides the first switch control signal $SCS_1$ to the first switching element 32, the second switch control signal $SCS_2$ to the second switching element 34, the third switch control signal $SCS_3$ to the third switching element 36, the fourth switch control signal $SCS_4$ to the fourth switching element 78, the fifth switch control signal $SCS_5$ to the fifth switching element 80, the sixth switch control signal $SCS_6$ to the sixth switching element 82, the seventh switch control signal $SCS_7$ to the seventh switching element 84, and the eighth switch control signal $SCS_8$ to the eighth switching element 86. Additional switch control signals (not shown) may be added to control any additional switching elements (not shown) that are added as needed.

In addition, the control circuitry 50 (not shown) provides the first capacitance control signal $CCS_1$ to the first variable shunt capacitance circuit 38, the second capacitance control signal $CCS_2$ to the second variable shunt capacitance circuit 40, the third capacitance control signal $CCS_3$ to the third variable shunt capacitance circuit 42, the fourth capacitance control signal $CCS_4$ to the fourth variable shunt capacitance circuit 44, the fifth capacitance control signal $CCS_5$ to the fifth variable shunt capacitance circuit 46, the sixth capacitance control signal $CCS_6$ to the sixth variable shunt capacitance circuit 48, the seventh capacitance control signal $CCS_7$ to the seventh variable shunt capacitance circuit 88, the eighth capacitance control signal $CCS_8$ to the eighth variable shunt capacitance circuit 90, the ninth capacitance control signal $CCS_9$ to the ninth variable shunt capacitance circuit 92, the tenth capacitance control signal $CCS_{10}$ to the tenth variable shunt capacitance circuit 94, the eleventh capacitance control signal $CCS_{11}$ to the eleventh variable shunt capacitance circuit 96, and the twelfth capacitance control signal $CCS_{12}$ to the twelfth variable shunt capacitance circuit 98. Additional capacitance control signals (not shown) may be added to control any additional variable shunt capacitance circuit (not shown) that are added as needed.

By providing the appropriate first, second, third, fourth, fifth, sixth, seventh, and eighth switch control signals $SCS_1$, $SCS_2$, $SCS_3$, $SCS_4$, $SCS_5$, $SCS_6$, $SCS_7$, $SCS_8$, the control circuitry 50 (not shown) may select either an OFF state or an ON state associated with each of the first, the second, the third, the fourth, the fifth, the sixth, the seventh, and the eighth switching elements 32, 34, 36, 78, 80, 82, 84, 86, respectively. When each ON state is selected, the first switching element 32 electrically couples the second connection node 26 to the input INPUT, the second switching element 34 electrically couples the first connection node 24 to the third connection node 28, the third switching element 36 electrically couples the fourth connection node 30 to the fifth connection node 66, the fourth switching element 78 electrically couples the sixth connection node 68 to the output OUTPUT, the fifth switching element 80 electrically couples the input INPUT to the seventh connection node 70, the sixth switching element 82 electrically couples the first connection node 24 to the eighth connection node 72, the seventh switching element 84 electrically couples the fifth connection node 66 to the ninth connection node 74, and the eighth switching element 86 electrically couples the output OUTPUT to the tenth connection node 76. When each OFF state is selected, the first switching element 32 does not intentionally provide a conduction path between the second connection node 26 and the input INPUT, the second switching element 34 does not intentionally provide a conduction path between the first connection node 24 and the third connection node 28, the third switching element 36 does not intentionally provide a conduction path between the fourth connection node 30 and the fifth connection node 66, the fourth switching element 78 does not intentionally provide a conduction path between the sixth connection node 68 and the output OUTPUT, the fifth switching element 80 does not intentionally provide a conduction path between the input INPUT and the seventh connection node 70, the sixth switching element 82 does not intentionally provide a conduction path between the first connection node 24 and the eighth connection node 72, the seventh switching element 84 does not intentionally provide a conduction path between the fifth connection node 66 and the ninth connection node 74, and the eighth switching element 86 does not intentionally provide a conduction path between the output OUTPUT and the tenth connection node 76.

By providing the appropriate first, second, third, fourth, fifth, sixth, seventh, eighth, ninth, tenth, eleventh, and twelfth capacitance control signals $CCS_1$, $CCS_2$, $CCS_3$, $CCS_4$, $CCS_5$, $CCS_6$, $CCS_7$, $CCS_8$, $CCS_9$, $CCS_{10}$, $CCS_{11}$, $CCS_{12}$, the control circuitry 50 (not shown) may select a desired capacitance associated with each of the first, the second, the third, the fourth, the fifth, the sixth, the seventh, the eighth, the ninth, the tenth, the eleventh, and the twelfth variable shunt capacitance circuits 38, 40, 42, 44, 46, 48, 88, 90, 92, 94, 96, 98, respectively. The first variable shunt capacitance circuit 38 presents a selected capacitance between ground and the input INPUT, the second variable shunt capacitance circuit 40 presents a selected capacitance between ground and the first connection node 24, the third variable shunt capacitance circuit 42 presents a selected capacitance between ground and the fifth connection node 66, the fourth variable shunt capacitance circuit 44 presents a selected capacitance between ground and the second connection node 26, the fifth variable shunt capacitance circuit 46 presents a selected capacitance between ground and the third connection node 28, the sixth variable shunt capacitance circuit 48 presents a selected capacitance between ground and the fourth connection node 30, the seventh variable shunt capacitance circuit 88 presents a selected capacitance between ground and the output OUTPUT, the eighth variable shunt capacitance circuit 90 presents a selected capacitance between ground and the sixth connection node 68, the ninth variable shunt capacitance circuit 92 presents a selected capacitance between ground and the seventh connection node 70, the tenth variable shunt capacitance circuit 94 presents a selected capacitance between ground and the eighth connection node 72, the eleventh variable shunt capacitance circuit 96 presents a selected capacitance between ground and the ninth connection node 74, and the twelfth variable shunt capacitance circuit 98 presents a selected capacitance between ground and the tenth connection node 76.

In a first exemplary embodiment of the first RF impedance translation circuit 10 illustrated in FIG. 4, N=3. In a second exemplary embodiment of the first RF impedance translation circuit 10 illustrated in FIG. 4, N=4. In a third exemplary embodiment of the first RF impedance translation circuit 10 illustrated in FIG. 4, N=5. In a fourth exemplary embodiment of the first RF impedance translation circuit 10 illustrated in FIG. 4, N=6. In a fifth exemplary embodiment of the first RF impedance translation circuit 10 illustrated in FIG. 4, N=7. In a sixth exemplary embodiment of the first RF impedance translation circuit 10 illustrated in FIG. 4, N=8. In a seventh exemplary embodiment of the first RF impedance translation circuit 10 illustrated in FIG. 4, N=9. In an eighth exemplary embodiment of the first RF impedance translation circuit 10 illustrated in FIG. 4, N=10. In a ninth exemplary embodiment of the first RF impedance translation circuit 10 illustrated in FIG. 4, N=11. In a tenth exemplary embodiment of the first RF impedance translation circuit 10 illustrated in FIG. 4, N=12. In an eleventh exemplary embodiment of the first RF impedance translation circuit 10 illustrated in FIG. 4, N=13. In a twelfth exemplary embodiment of the first RF impedance translation circuit 10 illustrated in FIG. 4, N=14. In a thirteenth exemplary embodiment of the first RF impedance translation circuit 10 illustrated in FIG. 4, N=15. In a fourteenth exemplary embodiment of the first RF impedance translation circuit 10 illustrated in FIG. 4, N=16. In a fifteenth exemplary embodiment of the first RF impedance translation circuit 10 illustrated in FIG. 4, N=17. In a sixteenth exemplary embodiment of the first RF impedance translation circuit 10 illustrated in FIG. 4, N=18. In a seventeenth exemplary embodiment of the first RF impedance translation circuit 10 illustrated in FIG. 4, N=19. In an eighteenth exemplary embodiment of the first RF impedance translation circuit 10 illustrated in FIG. 4, N=20. In a nineteenth exemplary embodiment of the first RF impedance translation circuit 10 illustrated in FIG. 4, N=21. In a twentieth exemplary embodiment of the first RF impedance translation circuit 10 illustrated in FIG. 4, N=22. In a twenty-first exemplary embodiment of the first RF impedance translation circuit 10 illustrated in FIG. 4, N is greater than 22.

In a twenty-second exemplary embodiment of the first RF impedance translation circuit 10 illustrated in FIG. 4, the Mth group 110 of inductive elements is omitted. In a twenty-third exemplary embodiment of the first RF impedance translation circuit 10 illustrated in FIG. 4, M=3. In a twenty-fourth exemplary embodiment of the first RF impedance translation circuit 10 illustrated in FIG. 4, M=4. In a twenty-fifth exemplary embodiment of the first RF impedance translation circuit 10 illustrated in FIG. 4, M=5. In a twenty-sixth exemplary embodiment of the first RF impedance translation circuit 10 illustrated in FIG. 4, M=6. In a twenty-seventh exemplary embodiment of the first RF impedance translation circuit 10 illustrated in FIG. 4, M=7. In a twenty-eighth exemplary embodiment of the first RF impedance translation circuit 10 illustrated in FIG. 4, M=8. In a twenty-ninth exemplary embodiment of the first RF impedance translation circuit 10 illustrated in FIG. 4, M=9. In a thirtieth exemplary embodiment of the first RF impedance translation circuit 10 illustrated in FIG. 4, M is greater than nine.

Any or all of the first, the second, the third, the fourth, the fifth, the sixth, the seventh, the eighth, the ninth, the tenth, the eleventh, the twelfth, the thirteenth, the fourteenth, the fifteenth, the sixteenth, the seventeenth, the eighteenth, the nineteenth, the twentieth, and the twenty-first exemplary embodiments of the first RF impedance translation circuit 10 illustrated in FIG. 4 may be combined with any or all of the twenty-second, the twenty-third, the twenty-fourth, the twenty-fifth, the twenty-sixth, the twenty-seventh, the twenty-eighth, the twenty-ninth, and the thirtieth exemplary embodiments of the first RF impedance translation circuit 10 illustrated in FIG. 4. By increasing the value of M, N, or both, a larger number of adjustment options is provided, thereby increasing the flexibility of the first RF impedance translation circuit 10. Further, increasing the value of M, N, or both, increases the number of connection nodes. Therefore, the number of switching elements, the number of variable shunt capacitance circuits, or both, and their respective control signals, may need to be increased accordingly.

Figure 5:
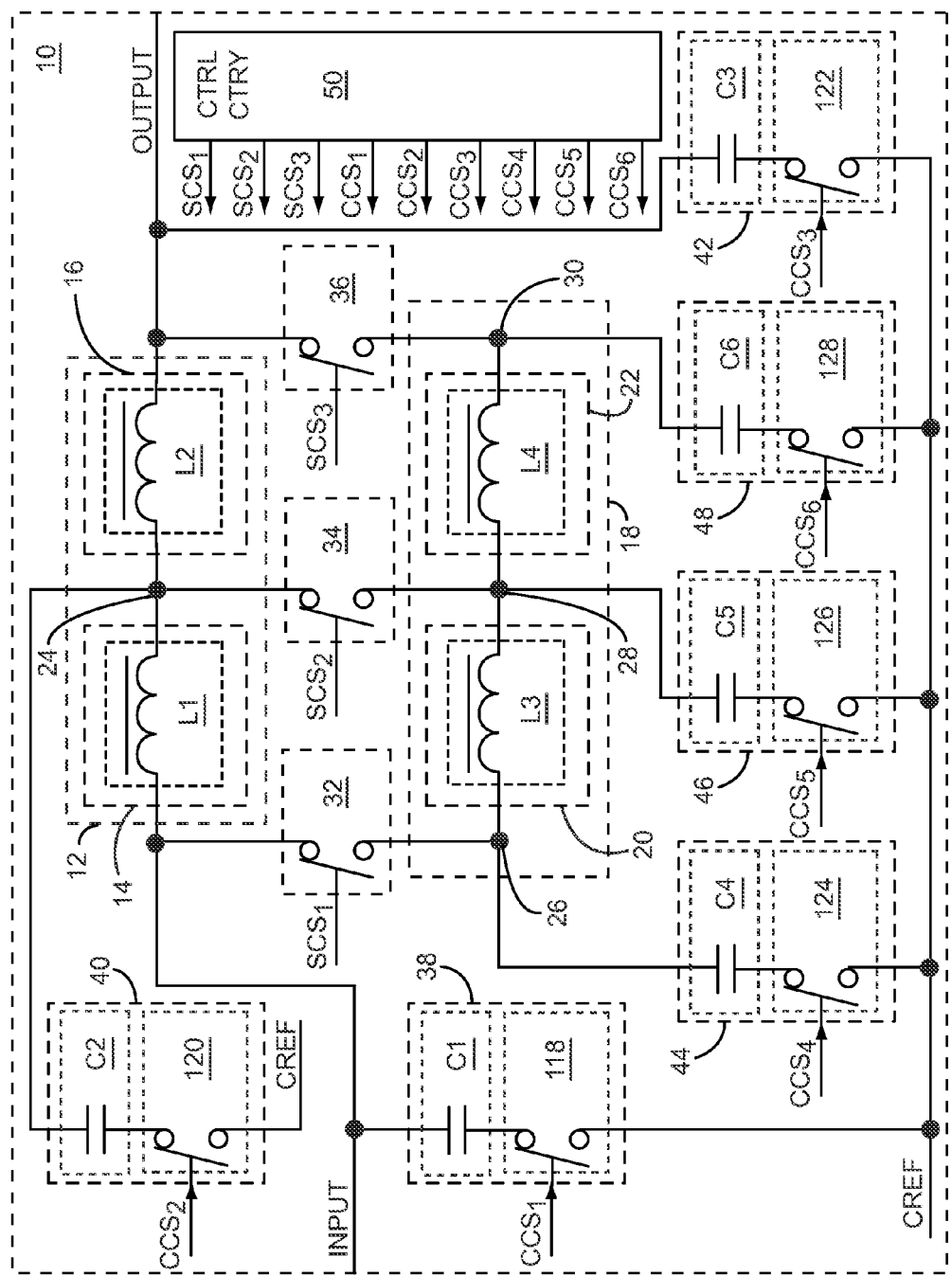
FIG. 5 shows details of the first RF impedance translation circuit illustrated in FIG. 1 according to an exemplary embodiment of the first RF impedance translation circuit.

FIG. 5 shows details of the first RF impedance translation circuit 10 illustrated in FIG. 1 according to an exemplary embodiment of the first RF impedance translation circuit 10. The first inductive element 14 includes a first discrete inductive element L1 electrically coupled between the input INPUT and the first connection node 24, and the second inductive element 16 includes a second discrete inductive element L2 electrically coupled between the output OUTPUT and the first connection node 24. The third inductive element 20 includes a third discrete inductive element L3 electrically coupled between the second connection node 26 and the third connection node 28, and the fourth inductive element 22 includes a fourth discrete inductive element L4 electrically coupled between the third connection node 28 and the fourth connection node 30.

The first variable shunt capacitance circuit 38 includes a first capacitance switching element 118 and a first switched capacitive element C1 electrically coupled in series between the common reference CREF and the input INPUT. The second variable shunt capacitance circuit 40 includes a second capacitance switching element 120 and a second switched capacitive element C2 electrically coupled in series between the common reference CREF and the first connection node 24. The third variable shunt capacitance circuit 42 includes a third capacitance switching element 122 and a third switched capacitive element C3 electrically coupled in series between the common reference CREF and the output OUTPUT. The fourth variable shunt capacitance circuit 44 includes a fourth capacitance switching element 124 and a fourth switched capacitive element C4 electrically coupled in series between the common reference CREF and the second connection node 26. The fifth variable shunt capacitance circuit 46 includes a fifth capacitance switching element 126 and a fifth switched capacitive element C5 electrically coupled in series between the common reference CREF and the third connection node 28. The sixth variable shunt capacitance circuit 48 includes a sixth capacitance switching element 128 and a sixth switched capacitive element C6 electrically coupled in series between the common reference CREF and the fourth connection node 30.

By providing the appropriate first, second, third, fourth, fifth, and sixth capacitance control signals $CCS_1$, $CCS_2$, $CCS_3$, $CCS_4$, $CCS_5$, $CCS_6$, the control circuitry 50 (not shown) may select either an OFF state or an ON state associated with each of the first, the second, the third, the fourth, the fifth, and the sixth capacitance switching elements 118, 120, 122, 124, 126, 128, respectively. When each ON state is selected, the first capacitance switching element 118 electrically couples the first switched capacitive element C1 between the input INPUT and the common reference CREF, the second capacitance switching element 120 electrically couples the second switched capacitive element C2 between the first connection node 24 and the common reference CREF, the third capacitance switching element 122 electrically couples the third switched capacitive element C3 between the output OUTPUT and the common reference CREF, the fourth capacitance switching element 124 electrically couples the fourth switched capacitive element C4 between the second connection node 26 and the common reference CREF, the fifth capacitance switching element 126 electrically couples the fifth switched capacitive element C5 between the third connection node 28 and the common reference CREF, and the sixth capacitance switching element 128 electrically couples the sixth switched capacitive element C6 between the fourth connection node 30 and the common reference CREF.

When each OFF state is selected, the first switched capacitive element C1 is not electrically coupled between the input INPUT and the common reference CREF, the second switched capacitive element C2 is not electrically coupled between the first connection node 24 and the common reference CREF, the third switched capacitive element C3 is not electrically coupled between the output OUTPUT and the common reference CREF, the fourth switched capacitive element C4 is not electrically coupled between the second connection node 26 and the common reference CREF, the fifth switched capacitive element C5 is not electrically coupled between the third connection node 28 and the common reference CREF, and the sixth switched capacitive element C6 is not electrically coupled between the fourth connection node 30 and the common reference CREF.

Figure 6A:
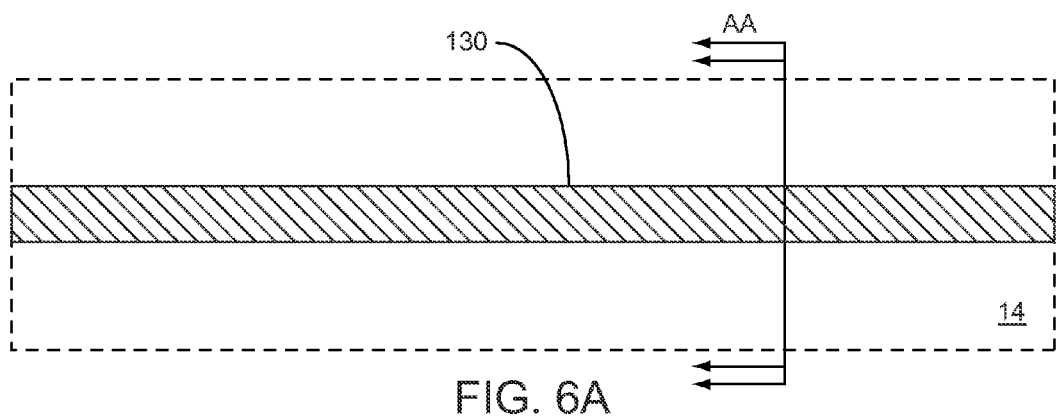
FIGS. 6A and 6B show details of a first inductive element according to one embodiment of the first inductive element.
Figure 6B:
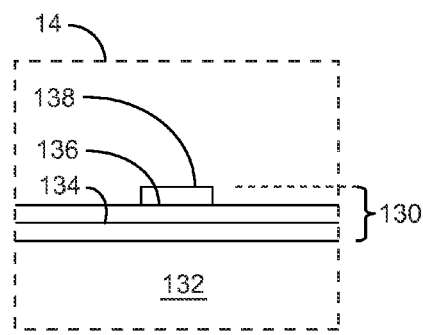

FIGS. 6A and 6B show details of the first inductive element 14 according to one embodiment of the first inductive element 14. FIG. 6A shows the first inductive element 14, which includes a transmission line segment 130. A first section AA identifies a cross-section of the first inductive element 14. FIG. 6B shows details of the first section AA, which includes a supporting structure 132, a ground plane 134 over the supporting structure 132, a first dielectric layer 136 over the ground plane 134 and a printed circuit board (PCB) trace 138 over the first dielectric layer 136. The transmission line segment 130 includes the ground plane 134, the first dielectric layer 136, and the PCB trace 138. Alternate embodiments of the transmission line segment 130 may include co-axial cable, twin-lead, parallel conductive elements, or the like. Any or all of the first, the second, the third, the fourth, the fifth, the sixth, the seventh, the eighth, the ninth, the Nth, the N+1, the N+2, the 2N, the N(M−1)+1, the N(M−1)+2, and the MNth inductive elements 14, 16, 20, 22, 54, 56, 60, 62, 64, 102, 104, 106, 108, 112, 114, 116 may each include a transmission line segment 130.

Figure 7A:
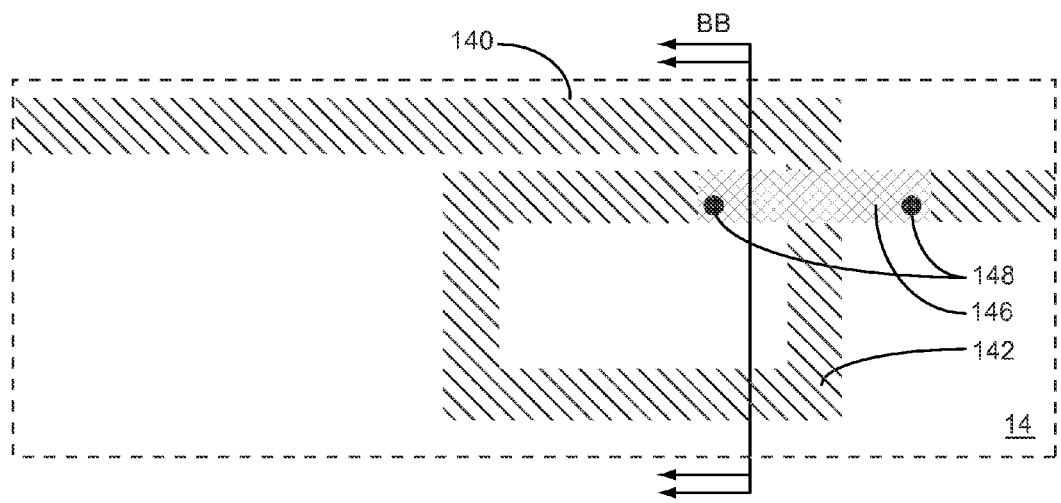
FIGS. 7A and 7B show details of the first inductive element according to an alternate embodiment of the first inductive element.
Figure 7B:
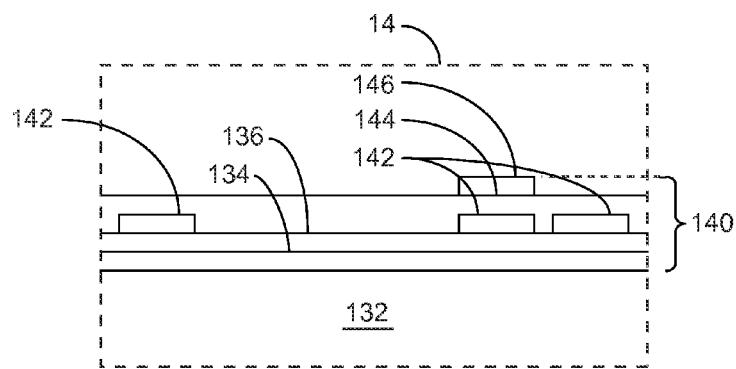

FIGS. 7A and 7B show details of the first inductive element 14 according to an alternate embodiment of the first inductive element 14. FIG. 7A shows the first inductive element 14, which includes a spiral transmission line segment 140. A second section BB identifies a cross-section of the first inductive element 14. FIG. 7B shows details of the second section BB, which includes the supporting structure 132, the ground plane 134 over the supporting structure 132, the first dielectric layer 136 over the ground plane 134, a spiral PCB trace 142 over the first dielectric layer 136, a second dielectric layer 144 over the spiral PCB trace 142, and a bridging PCB trace 146 over the second dielectric layer 144. The bridging PCB trace 146 crosses over the spiral PCB trace 142 and is electrically coupled to the spiral PCB trace 142 using via holes 148. The spiral transmission line segment 140 includes the ground plane 134, the first dielectric layer 136, the spiral PCB trace 142, the second dielectric layer 144, and the bridging PCB trace 146. The spiral shape of the spiral PCB trace 142 may increase inductance of the spiral transmission line segment 140 compared to the transmission line segment 130. Any or all of the first, the second, the third, the fourth, the fifth, the sixth, the seventh, the eighth, the ninth, the Nth, the N+1, the N+2, the 2Nth, the N(M−1)+1, the N(M−1)+2, and the MNth inductive elements 14, 16, 20, 22, 54, 56, 60, 62, 64, 102, 104, 106, 108, 112, 114, 116 may each include a transmission line segment 130.

Figure 8A:
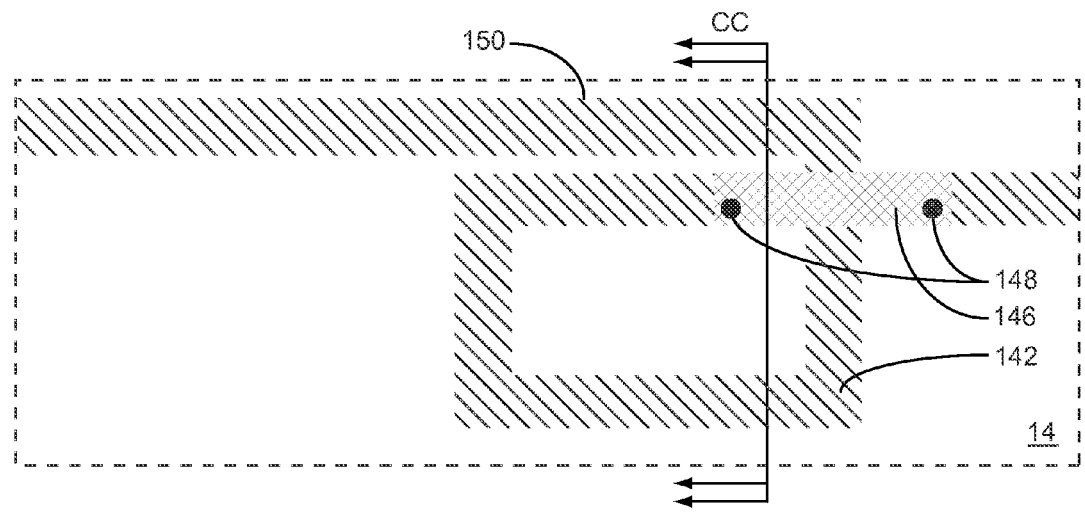
FIGS. 8A and 8B show details of the first inductive element according to an additional embodiment of the first inductive element.
Figure 8B:
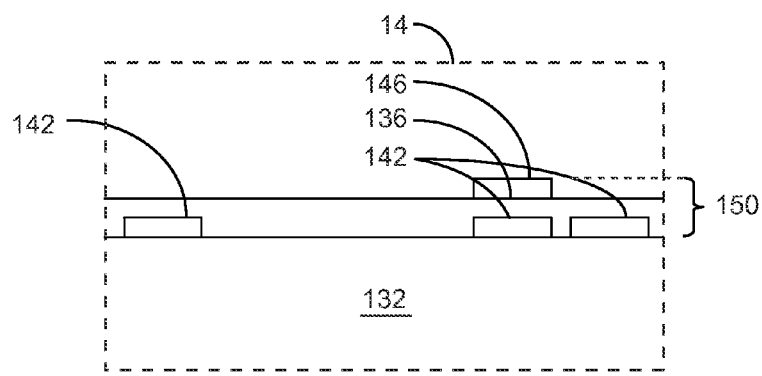

FIGS. 8A and 8B show details of the first inductive element 14 according to an additional embodiment of the first inductive element 14. FIG. 8A shows the first inductive element 14, which includes a spiral PCB segment 150. A third section CC identifies a cross-section of the first inductive element 14. FIG. 8B shows details of the third section CC, which includes the supporting structure 132, the spiral PCB trace 142 over the supporting structure 132, the first dielectric layer 136 over the spiral PCB trace 142, and the bridging PCB trace 146 over the first dielectric layer 136. The bridging PCB trace 146 crosses over the spiral PCB trace 142 and is electrically coupled to the spiral PCB trace 142 using via holes 148. The spiral PCB segment 150 includes the first dielectric layer 136, the spiral PCB trace 142, and the bridging PCB trace 146. The spiral shape of the spiral PCB trace 142 may increase inductance of the spiral PCB segment 150 and other PCB segments (not shown). Any or all of the first, the second, the third, the fourth, the fifth, the sixth, the seventh, the eighth, the ninth, the Nth, the N+1, the N+2, the 2Nth, the N(M−1)+1, the N(M−1)+2, and the MNth inductive elements 14, 16, 20, 22, 54, 56, 60, 62, 64, 102, 104, 106, 108, 112, 114, 116 may each include a transmission line segment 130.

Figure 9:
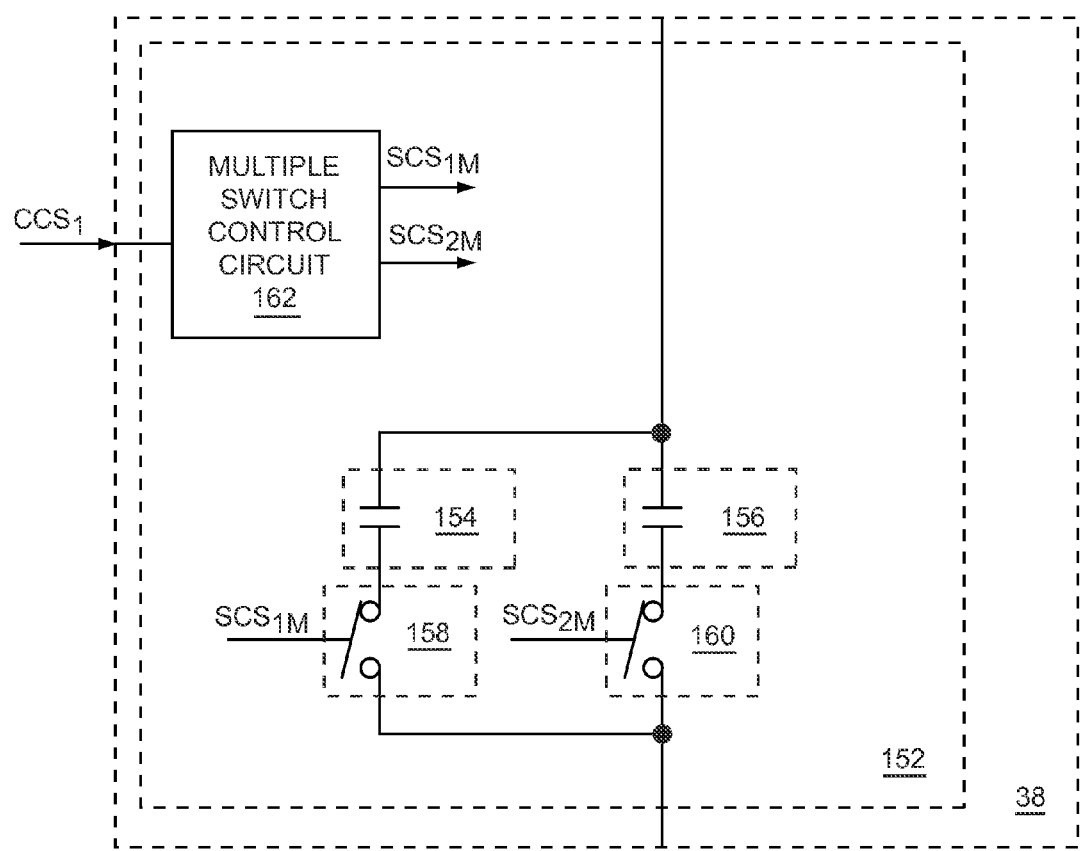
FIG. 9 shows details of a first variable shunt capacitance circuit according to one embodiment of the first variable shunt capacitance circuit.

FIG. 9 shows details of the first variable shunt capacitance circuit 38 according to one embodiment of the first variable shunt capacitance circuit 38. The first variable shunt capacitance circuit 38 includes a multiple capacitive element circuit 152, which includes a first multiple capacitive element 154, a second multiple capacitive element 156, a first multiple switching element 158, a second multiple switching element 160, and a multiple switch control circuit 162. The first multiple capacitive element 154 and the first multiple switching element 158 are electrically coupled in series. Similarly, the second multiple capacitive element 156 and the second multiple switching element 160 are electrically coupled in series and then coupled in parallel with the series coupled first multiple capacitive element 154 and first multiple switching element 158.

The multiple switch control circuit 162 receives the first capacitance control signal $CCS_1$ and provides a first multiple switch control signal $SCS_{1M}$ and a second multiple switch control signal $SCS_{2M}$ to the first multiple switching element 158 and the second multiple switching element 160, respectively, based on the first capacitance control signal $CCS_1$. The multiple switch control circuit 162 may select either an ON state or an OFF state associated with each of the first and the second multiple switching elements 158, 160 to include or exclude the first and the second multiple capacitive elements 154, 156, respectively, from contributing to the capacitance of the multiple capacitive element circuit 152. Any or all of the first, the second, the third, the fourth, the fifth, the sixth, the seventh, the eighth, the ninth, the tenth, the eleventh, and the twelfth variable shunt capacitance circuits 38, 40, 42, 44, 46, 48, 88, 90, 92, 94, 96, 98 may each include a multiple capacitive element circuit 152.

Figure 10:
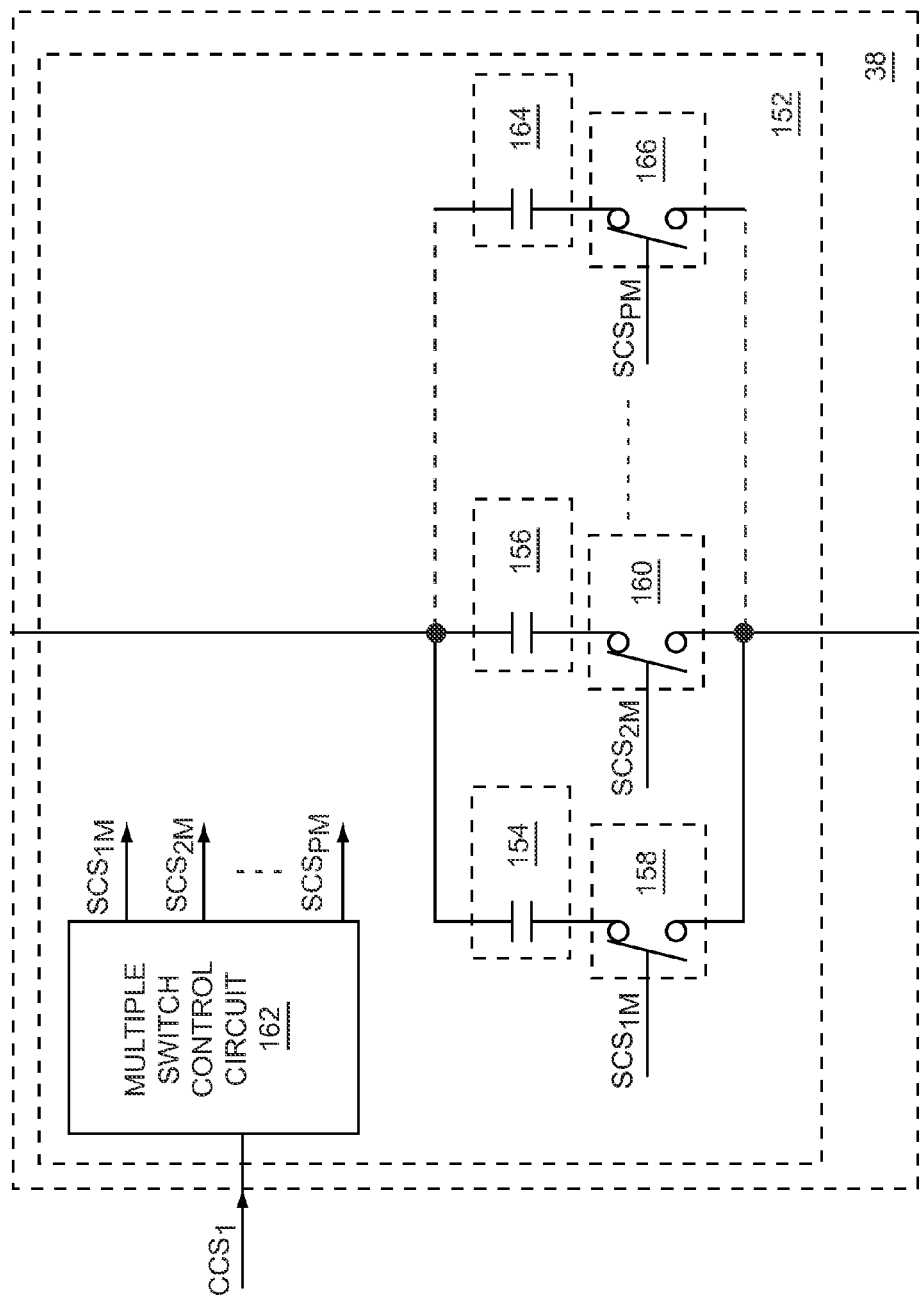
FIG. 10 shows details of the first variable shunt capacitance circuit according to an alternate embodiment of the first variable shunt capacitance circuit.

FIG. 10 shows details of the first variable shunt capacitance circuit 38 according to an alternate embodiment of the first variable shunt capacitance circuit 38. The first variable shunt capacitance circuit 38 includes the multiple capacitive element circuit 152, which includes the first multiple capacitive element 154, the second multiple capacitive element 156, up to and including a Pth multiple capacitive element 164, the first multiple switching element 158, the second multiple switching element 160, up to and including a Pth multiple switching element 166, and the multiple switch control circuit 162. The first multiple capacitive element 154 and the first multiple switching element 158 are electrically coupled in series. Similarly, the second multiple capacitive element 156 and the second multiple switching element 160 are electrically coupled in series. Further, the Pth multiple capacitive element 164 and the Pth multiple switching element 166 are electrically coupled in series. The series coupled elements are then coupled in parallel.

The multiple switch control circuit 162 receives the first capacitance control signal $CCS_1$ and provides the first multiple switch control signal $SCS_{1M}$, the second multiple switch control signal $SCS_{2M}$, up to and including a Pth multiple switch control signal $SCS_{PM}$ to the first multiple switching element 158, the second multiple switching element 160, and up to and including the Pth multiple switching element 166, respectively, based on the first capacitance control signal $CCS_1$. The multiple switch control circuit 162 may select either an ON state or an OFF state associated with each of the first, the second, and up to and including the Pth multiple switching elements 158, 160, 166 to include or exclude the first, the second, and up to and including the Pth multiple capacitive elements 154, 156, 164, respectively, from contributing to the capacitance of the multiple capacitive element circuit 152. Any or all of the first, the second, the third, the fourth, the fifth, the sixth, the seventh, the eighth, the ninth, the tenth, the eleventh, and the twelfth variable shunt capacitance circuits 38, 40, 42, 44, 46, 48, 88, 90, 92, 94, 96, 98 may each include a multiple capacitive element circuit 152.

Figure 11:
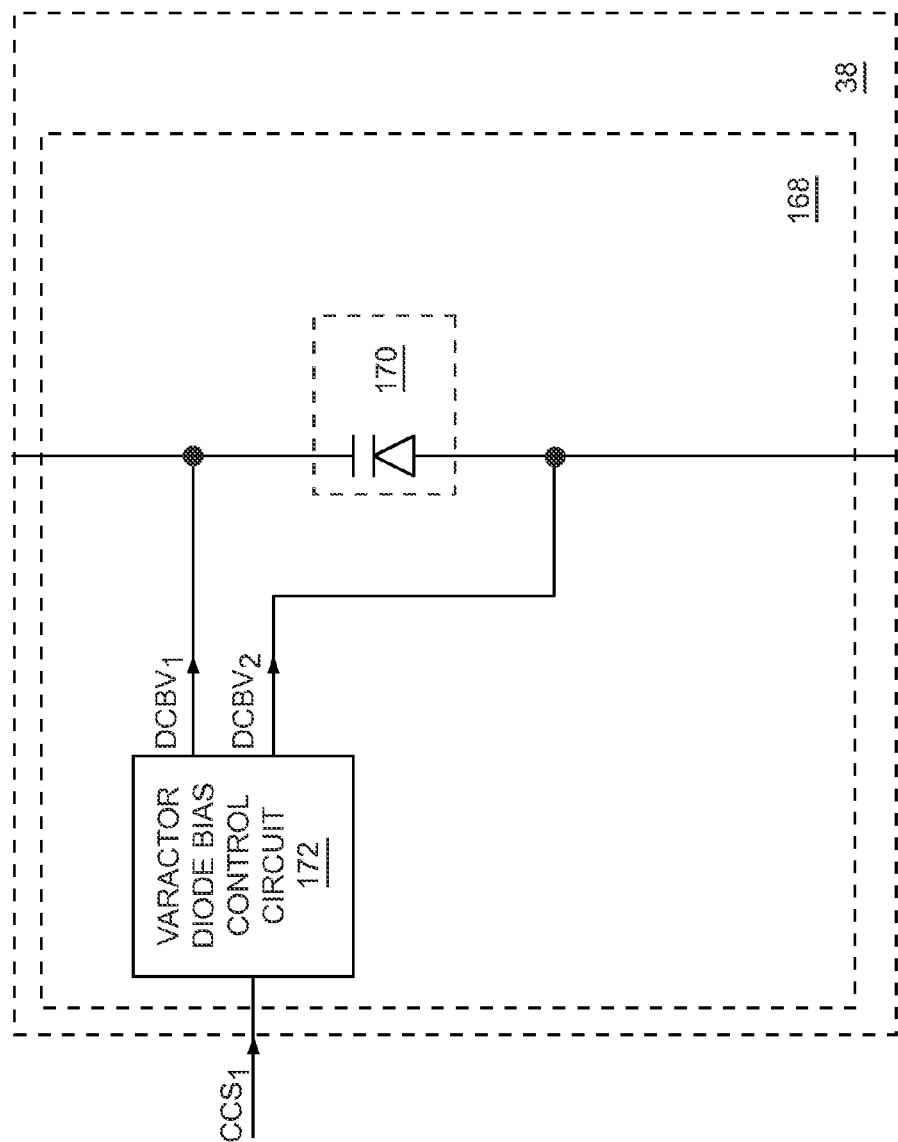
FIG. 11 shows details of the first variable shunt capacitance circuit according to an additional embodiment of the first variable shunt capacitance circuit.

FIG. 11 shows details of the first variable shunt capacitance circuit 38 according to an additional embodiment of the first variable shunt capacitance circuit 38. The first variable shunt capacitance circuit 38 includes a varactor diode circuit 168, which includes a varactor diode 170 and a varactor diode bias control circuit 172. The varactor diode bias control circuit 172 receives the first capacitance control signal $CCS_1$ and provides a first DC bias voltage $DCBV_1$ and a second DC bias voltage $DCBV_2$ based on the first capacitance control signal $CCS_1$. The varactor diode 170 provides capacitance for the varactor diode circuit 168 based on a DC bias voltage across the varactor diode 170, which is the difference between the first DC bias voltage $DCBV_1$ and the second DC bias voltage $DCBV_2$. Any or all of the first, the second, the third, the fourth, the fifth, the sixth, the seventh, the eighth, the ninth, the tenth, the eleventh, and the twelfth variable shunt capacitance circuits 38, 40, 42, 44, 46, 48, 88, 90, 92, 94, 96, 98 may each include a varactor diode circuit 168.

Figure 12A:
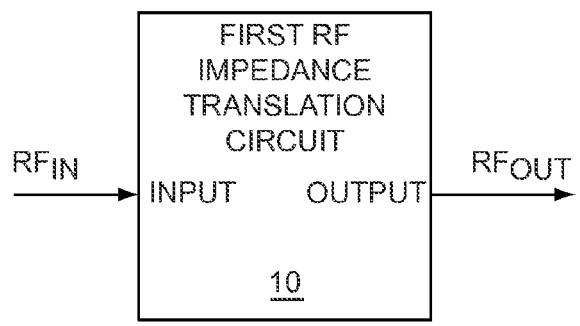
FIG. 12A shows one embodiment of the first RF impedance translation circuit.

FIG. 12A shows one embodiment of the first RF impedance translation circuit 10. The input INPUT of the first RF impedance translation circuit 10 receives an RF input signal $RF_{IN}$ and the output OUTPUT of the first RF impedance translation circuit 10 provides an RF output signal $RF_{OUT}$ based on the RF input signal $RF_{IN}$.

Figure 12B:
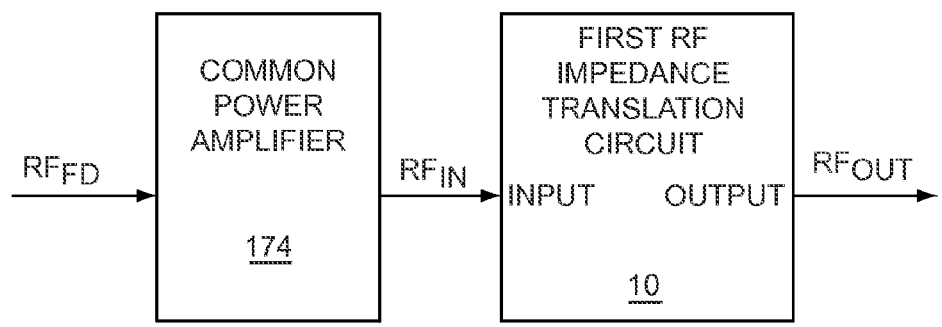
FIG. 12B shows the first RF impedance translation circuit illustrated in FIG. 12A used with a common power amplifier according to one embodiment of the present invention.

FIG. 12B shows the first RF impedance translation circuit 10 illustrated in FIG. 12A used with a common power amplifier 174 according to one embodiment of the present invention. The common power amplifier 174 receives an RF feed signal $RF_{FD}$ and provides the RF input signal $RF_{IN}$ to the first RF impedance translation circuit 10 based on the RF feed signal $RF_{FD}$. The common power amplifier 174 and the first RF impedance translation circuit 10 may operate using two or more RF communications bands. In an exemplary embodiment of the present invention, the common power amplifier 174 and the first RF impedance translation circuit 10 operate in either a first operating mode or a second operating mode, such that during the first operating mode, the common power amplifier 174 and the first RF impedance translation circuit 10 operate using a first RF communications band and during the second operating mode, the common power amplifier 174 and the first RF impedance translation circuit 10 operate using a second RF communications band. The first RF communications band may be a high band, such as a 1.9 gigahertz mobile phone band, and the second RF communications band may be a low band, such as an 800 megahertz mobile phone band. The first RF communications band may have a first center frequency and the second RF communications band may have a second center frequency, such that a ratio of the first center frequency to the second center frequency is greater than two.

For good power transfer, an output impedance from the common power amplifier 174 should approximately match an impedance presented at the input INPUT of first RF impedance translation circuit 10. Since a first impedance presented to the output OUTPUT of the first RF impedance translation circuit 10 may be translated into a second impedance presented at the input INPUT of first RF impedance translation circuit 10, the second impedance should approximately match the output impedance from the common power amplifier 174.

Figure 13:
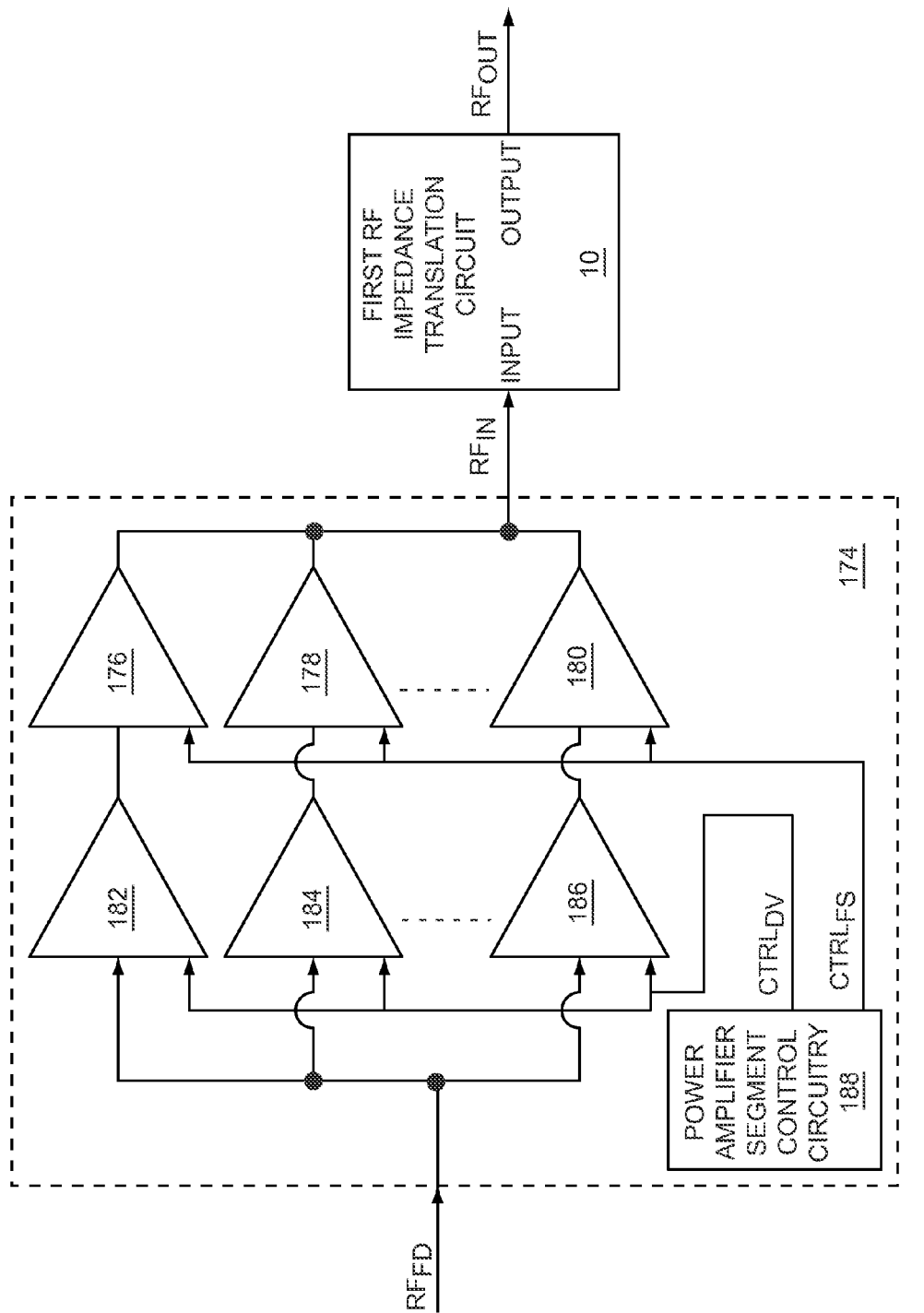
FIG. 13 shows details of the common power amplifier illustrated in FIG. 12B according to one embodiment of the common power amplifier.

FIG. 13 shows details of the common power amplifier 174 illustrated in FIG. 12B according to one embodiment of the common power amplifier 174. The common power amplifier 174 includes a first final stage segment 176, a second final stage segment 178, up to and including an Nth final stage segment 180, a first driver stage segment 182, a second driver stage segment 184, up to and including an Nth driver stage segment 186, and power amplifier segment control circuitry 188. When the first, the second, and up to and including the Nth driver stage segments 182, 184, 186 are in an ENABLED state, and when the first, the second, and up to and including the Nth final stage segments 176, 178, 180 are in an ENABLED state, the first driver stage segment 182, the second driver stage segment 184, and up to and including the Nth driver stage segment 186 receive the RF feed signal $RF_{FD}$ and feed the first final stage segment 176, the second final stage segment 178, and up to and including the Nth final stage segment 180, respectively, based on amplifying the RF feed signal $RF_{FD}$. The first, the second, and up to and including the Nth final stage segments 176, 178, 180 amplify and combine the signals fed from the first, the second, and up to and including the Nth driver stage segments 182, 184, 186, respectively, to provide the RF input signal $RF_{IN}$ to the first RF impedance translation circuit 10. When any of the first, the second, and up to and including the Nth driver stage segments 182, 184, 186 are in a DISABLED state, an output from the DISABLED driver stage segment may be driven to zero volts.

When any of the first, the second, and up to and including the Nth final stage segments 176, 178, 180 are in a DISABLED state, an output from the DISABLED final stage segment may be in a high impedance condition. As a result, an output power level from the common power amplifier 174 may be controlled by selectively enabling or disabling driver stage segment and final stage segment pairs. When all of the final stage segments are in an ENABLED state, the output impedance from the common power amplifier 174 may be at a minimum, and as final stage segments are DISABLED, the output impedance increases. Therefore, for the second impedance presented from the first RF impedance translation circuit 10 to remain approximately matched to the output impedance from the common power amplifier 174, the impedance translation characteristics of the first RF impedance translation circuit 10 may need to be adjusted.

For example, in an exemplary embodiment of the present invention, when one or more of the final stage segments is in DISABLED state, the common power amplifier 174 has a first output power level and a first output impedance. When the final stage segments that were previously DISABLED are now in an ENABLED state, the common power amplifier 174 has a second output power level and a second output impedance, such that the second output power level is greater than the first output power level and the second output impedance is less than the first output impedance. The impedance translation characteristics of the first RF impedance translation circuit 10 may be adjusted such that the second impedance presented from the first RF impedance translation circuit 10 remains about matched to the first output impedance and to the second output impedance.

Figure 14:
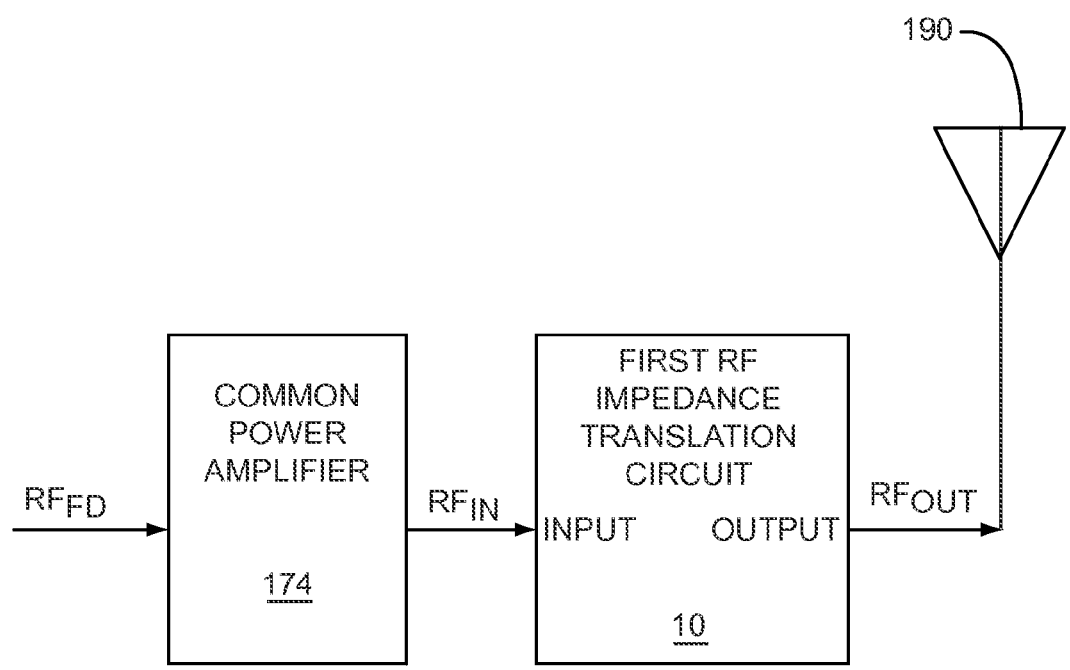
FIG. 14 shows the first RF impedance translation circuit illustrated in FIG. 12A used with the common power amplifier and an RF antenna according to an alternate embodiment of the present invention.

FIG. 14 shows the first RF impedance translation circuit 10 illustrated in FIG. 12A used with the common power amplifier 174 and an RF antenna 190 according to an alternate embodiment of the present invention. The common power amplifier 174 receives the RF feed signal $RF_{FD}$ and provides the RF input signal $RF_{IN}$ to the first RF impedance translation circuit 10 based on the RF feed signal $RF_{FD}$. The RF antenna 190 is coupled to the output OUTPUT of the first RF impedance translation circuit 10, such that the first RF impedance translation circuit 10 provides the RF output signal $RF_{OUT}$ to the RF antenna 190. Since the first impedance presented to the output OUTPUT of the first RF impedance translation circuit 10 may be translated into the second impedance presented at the input INPUT of first RF impedance translation circuit 10, the first impedance is based on the RF antenna 190.

Figure 15:
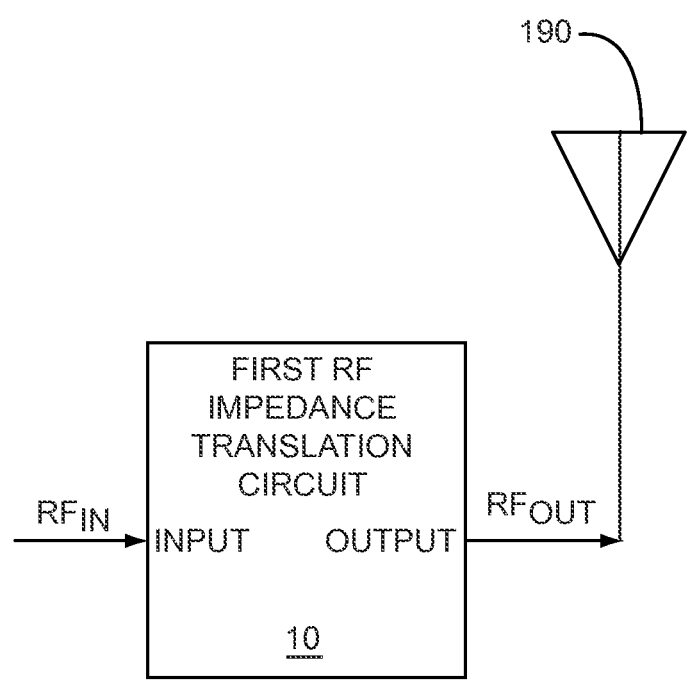
FIG. 15 shows the first RF impedance translation circuit illustrated in FIG. 12A used with the RF antenna according to an additional embodiment of the present invention.

FIG. 15 shows the first RF impedance translation circuit 10 illustrated in FIG. 12A used with the RF antenna 190 according to an additional embodiment of the present invention. The RF antenna 190 is coupled to the output OUTPUT of the first RF impedance translation circuit 10, such that the first RF impedance translation circuit 10 provides the RF output signal $RF_{OUT}$ to the RF antenna 190. Since the first impedance presented to the output OUTPUT of the first RF impedance translation circuit 10 may be translated into the second impedance presented at the input INPUT of first RF impedance translation circuit 10, the first impedance is based on the RF antenna 190. The RF antenna 190 may have a voltage standing wave ratio (VSWR) based on antenna loading conditions. The first impedance may be based on the VSWR; however, the impedance translation characteristics of the first RF impedance translation circuit 10 may be adjusted such that the second impedance presented from the first RF impedance translation circuit 10 may remain about constant in the presence of VSWR variations. For example, in an exemplary embodiment of the present invention, when the RF antenna 190 has a VSWR of about one-to-one, the second impedance has a first magnitude and when the RF antenna 190 has a VSWR of about four-to-one, the impedance translation characteristics of the first RF impedance translation circuit 10 are adjusted such that the second impedance has a second magnitude, such that the first magnitude is about equal to the second magnitude.

Figure 16:
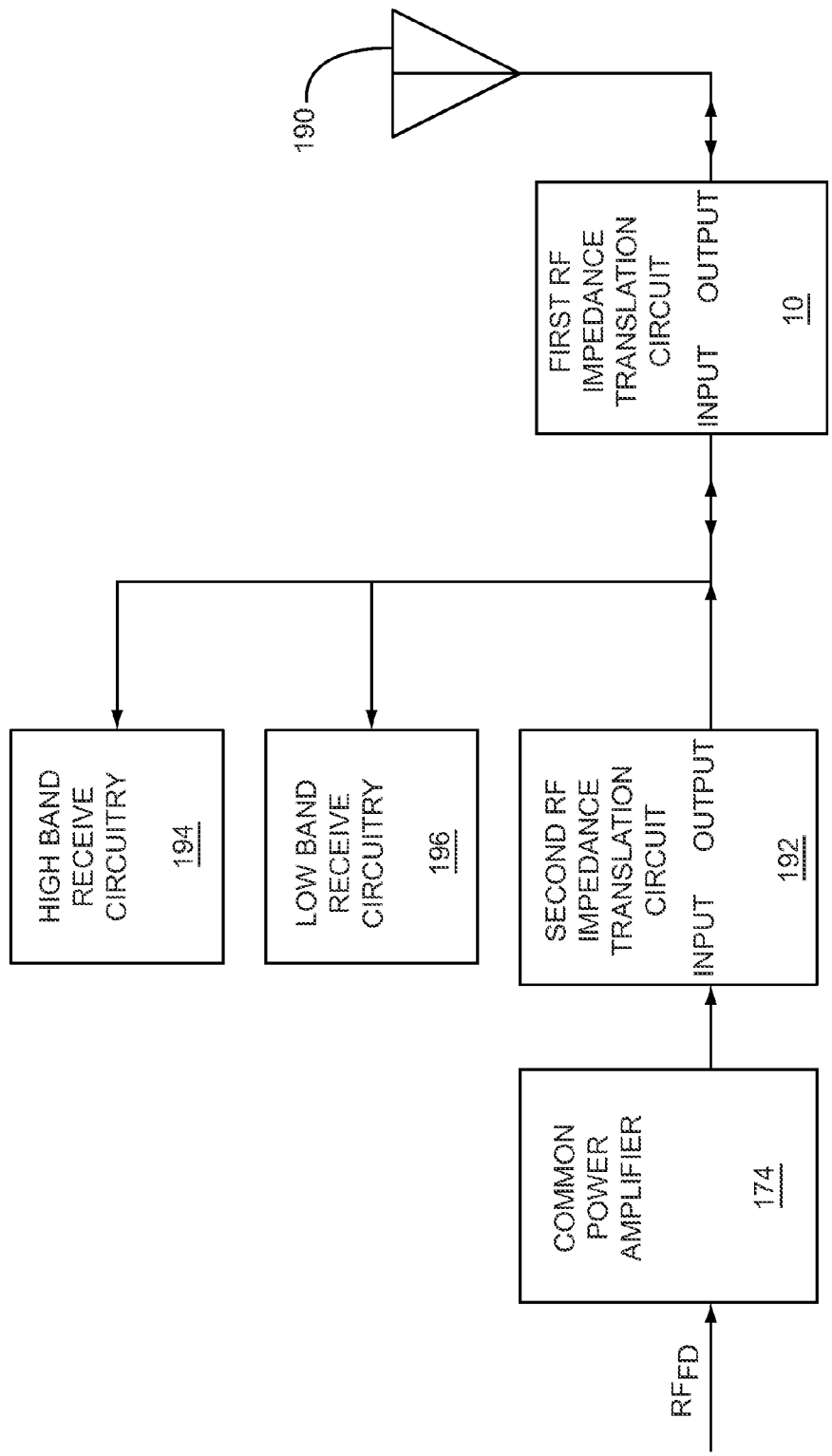
FIG. 16 shows the first RF impedance translation circuit illustrated in FIG. 12A used with a second RF impedance translation circuit according to another embodiment of the present invention.

FIG. 16 shows the first RF impedance translation circuit 10 illustrated in FIG. 12A used with a second RF impedance translation circuit 192 according to another embodiment of the present invention. The common power amplifier 174 receives the RF feed signal $RF_{FD}$ and feeds the input INPUT of the second RF impedance translation circuit 192 based on the RF feed signal $RF_{FD}$. The output OUTPUT of the second RF impedance translation circuit 192 is coupled to the input INPUT of the first RF impedance translation circuit 10, such that the second RF impedance translation circuit 192 provides the RF input signal $RF_{IN}$ (not shown) to the first RF impedance translation circuit 10. The RF antenna 190 is coupled to the output OUTPUT of the first RF impedance translation circuit 10. High band receive circuitry 194 and low band receive circuitry 196 are coupled to the input INPUT of the first RF impedance translation circuit 10. When receiving RF signals, the RF antenna 190 provides the received RF signals to the first RF impedance translation circuit 10, which forwards the received RF signals to the high band receive circuitry 194 or the low band receive circuitry 196. When transmitting RF signals, the common power amplifier 174 receives the RF feed signal $RF_{FD}$ and feeds the input INPUT of the second RF impedance translation circuit 192, which forwards an amplified RF feed signal $RF_{FD}$ to the input INPUT of the first RF impedance translation circuit 10, which forwards the amplified RF feed signal $RF_{FD}$ to the RF antenna 190. The first RF impedance translation circuit 10 and the second RF impedance translation circuit 192 may adjust their impedance translation characteristics to maintain about a constant impedance between the input INPUT of the first RF impedance translation circuit 10 and output OUTPUT of the second RF impedance translation circuit 192.

Figure 17:
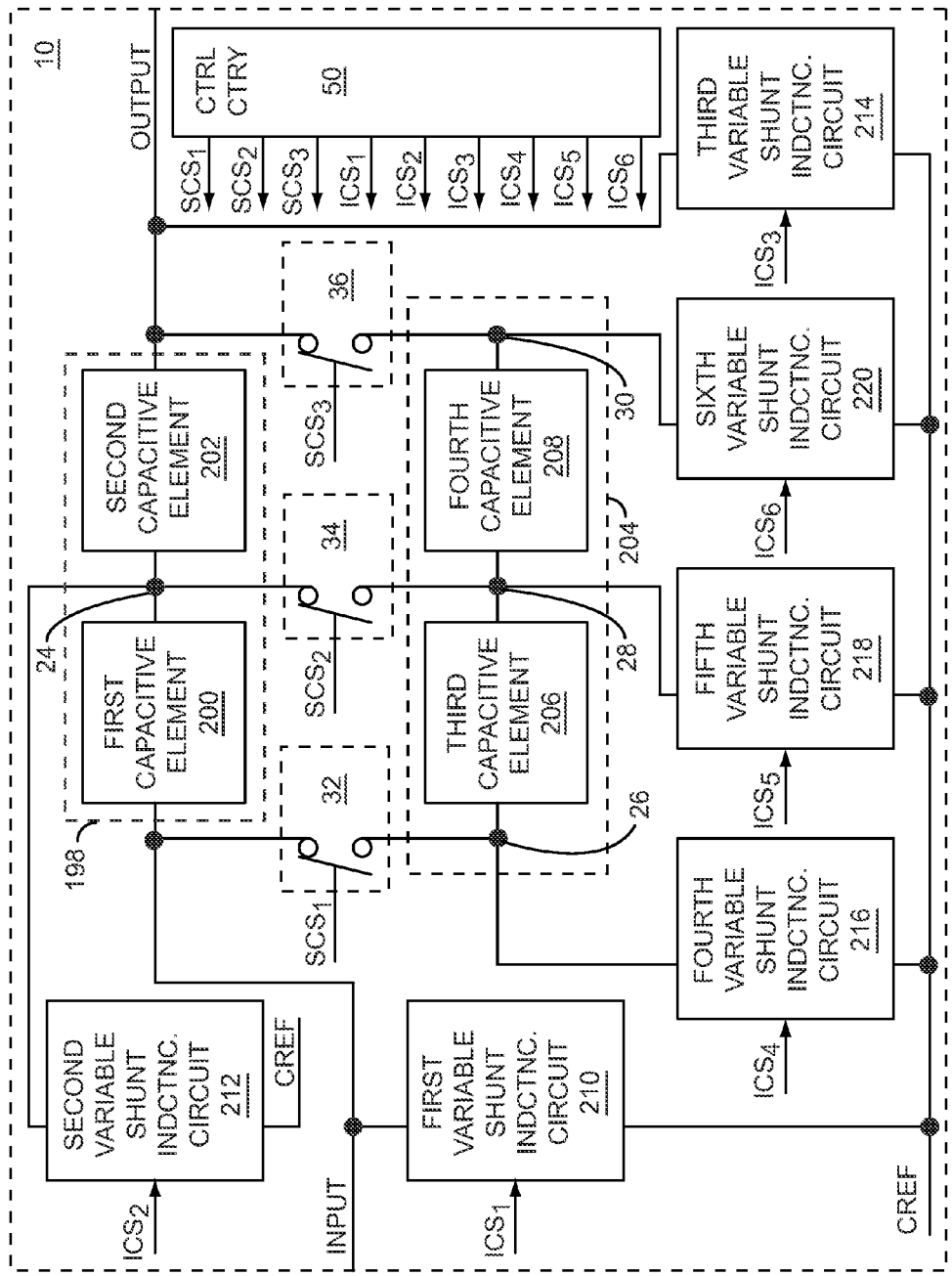
FIG. 17 shows the first RF impedance translation circuit according to a supplemental embodiment of the first RF impedance translation circuit.

FIG. 17 shows the first RF impedance translation circuit 10 according to a supplemental embodiment of the first RF impedance translation circuit 10. The first RF impedance translation circuit 10 illustrated in FIG. 17 is similar to the first RF impedance translation circuit 10 illustrated in FIG. 1, except the inductive elements illustrated in FIG. 1 are replaced with capacitive elements in FIG. 17, the variable shunt capacitance circuits illustrated in FIG. 1 are replaced with variable shunt inductance circuits in FIG. 17, and the capacitance control signals illustrated in FIG. 1 are replaced with inductance control signals in FIG. 17.

Specifically, the first RF impedance translation circuit 10 includes a first group 198 of capacitive elements, which includes a first capacitive element 200 and a second capacitive element 202, and a second group 204 of capacitive elements, which includes a third capacitive element 206 and a fourth capacitive element 208. The first group 198 of capacitive elements is cascaded in series between the input INPUT and the output OUTPUT using the first connection node 24, such that the first capacitive element 200 is electrically coupled between the input INPUT and the first connection node 24, and the second capacitive element 202 is electrically coupled between the output OUTPUT and the first connection node 24. The second group 204 of capacitive elements is cascaded in series using multiple connection nodes, such that the third capacitive element 206 is electrically coupled between the second connection node 26 and the third connection node 28, and the fourth capacitive element 208 is electrically coupled between the fourth connection node 30 and the third connection node 28.

The first RF impedance translation circuit 10 includes a group of switching elements that are capable of electrically coupling the first group 198 of capacitive elements to the second group 204 of capacitive elements. Specifically, the first switching element 32 is electrically coupled between the second connection node 26 and the input INPUT, the second switching element 34 is electrically coupled between the first connection node 24 and the third connection node 28, and the third switching element 36 is electrically coupled between the fourth connection node 30 and the output OUTPUT.

Further, the first RF impedance translation circuit 10 includes at least one variable shunt inductance circuit electrically coupled between a common reference CREF and at least one connection node in the first RF impedance translation circuit 10. Specifically, the first RF impedance translation circuit 10 includes a first variable shunt inductance circuit 210 electrically coupled between the common reference CREF and the input INPUT, a second variable shunt inductance circuit 212 electrically coupled between the common reference CREF and the first connection node 24, a third variable shunt inductance circuit 214 electrically coupled between the common reference CREF and the output OUTPUT, a fourth variable shunt inductance circuit 216 electrically coupled between the common reference CREF and the second connection node 26, a fifth variable shunt inductance circuit 218 electrically coupled between the common reference CREF and the third connection node 28, and a sixth variable shunt inductance circuit 220 electrically coupled between the common reference CREF and the fourth connection node 30.

Additionally, the first RF impedance translation circuit 10 includes the control circuitry 50, which provides the first switch control signal $SCS_1$ to the first switching element 32, the second switch control signal $SCS_2$ to the second switching element 34, the third switch control signal $SCS_3$ to the third switching element 36, a first inductance control signal $ICS_1$ to the first variable shunt inductance circuit 210, a second inductance control signal $ICS_2$ to the second variable shunt inductance circuit 212, a third inductance control signal $ICS_3$ to the third variable shunt inductance circuit 214, a fourth inductance control signal $ICS_4$ to the fourth variable shunt inductance circuit 216, a fifth inductance control signal $ICS_5$ to the fifth variable shunt inductance circuit 218, and a sixth inductance control signal $ICS_6$ to the sixth variable shunt inductance circuit 220.

By providing the appropriate first switch control signal $SCS_1$, second switch control signal $SCS_2$, and third switch control signal $SCS_3$, the control circuitry 50 may select either an OFF state or an ON state associated with each of the first switching element 32, the second switching element 34, and the third switching element 36, respectively. When each ON state is selected, the first switching element 32 electrically couples the second connection node 26 to the input INPUT, the second switching element 34 electrically couples the first connection node 24 to the third connection node 28, and the third switching element 36 electrically couples the fourth connection node 30 to the output OUTPUT. When each OFF state is selected, the first switching element 32 does not intentionally provide a conduction path between the second connection node 26 and the input INPUT, the second switching element 34 does not intentionally provide a conduction path between the first connection node 24 and the third connection node 28, and the third switching element 36 does not intentionally provide a conduction path between the fourth connection node 30 and the output OUTPUT.

By providing the appropriate first inductance control signal $ICS_1$, second inductance control signal $ICS_2$, third inductance control signal $ICS_3$, fourth inductance control signal $ICS_4$, fifth inductance control signal $ICS_5$, and sixth inductance control signal $ICS_6$, the control circuitry 50 may select a desired inductance associated with each of the first variable shunt inductance circuit 210, the second variable shunt inductance circuit 212, the third variable shunt inductance circuit 214, the fourth variable shunt inductance circuit 216, the fifth variable shunt inductance circuit 218, and the sixth variable shunt inductance circuit 220, respectively. The first variable shunt inductance circuit 210 presents a selected inductance between the common reference CREF and the input INPUT, the second variable shunt inductance circuit 212 presents a selected inductance between the common reference CREF and the first connection node 24, the third variable shunt inductance circuit 214 presents a selected inductance between the common reference CREF and the output OUTPUT, the fourth variable shunt inductance circuit 216 presents a selected inductance between the common reference CREF and the second connection node 26, the fifth variable shunt inductance circuit 218 presents a selected inductance between the common reference CREF and the third connection node 28, and the sixth variable shunt inductance circuit 220 presents a selected inductance between the common reference CREF and the fourth connection node 30.

A first impedance presented to the output OUTPUT may be translated into a second impedance presented at the input INPUT based on the selected inductances associated with each of the first, the second, the third, the fourth, the fifth, and the sixth variable shunt inductance circuits 210, 212, 214, 216, 218, 220 and the switching states of the first, the second, and the third switching elements 32, 34, 36. Further, impedance translation characteristics of the first RF impedance translation circuit 10 may be based on the selected inductances associated with each of the first, the second, the third, the fourth, the fifth, and the sixth variable shunt inductance circuits 210, 212, 214, 216, 218, 220 and the switching states of the first, the second, and the third switching elements 32, 34, 36. In general, the impedance translation characteristics of the first RF impedance translation circuit 10 may be based on each inductance control signal and on each switch control signal, and the first impedance presented to the output OUTPUT may be translated into the second impedance presented at the input INPUT based on each inductance control signal and on each switch control signal.

In a first exemplary embodiment of the first RF impedance translation circuit 10 illustrated in FIG. 17, one of the first switching element 32, the second switching element 34, and the third switching element 36, and a corresponding one of the first switch control signal $SCS_1$, the second switch control signal $SCS_2$, and the third switch control signal $SCS_3$ are omitted.

In a second exemplary embodiment of the first RF impedance translation circuit 10 illustrated in FIG. 17, one of the first variable shunt inductance circuit 210, the second variable shunt inductance circuit 212, the third variable shunt inductance circuit 214, the fourth variable shunt inductance circuit 216, the fifth variable shunt inductance circuit 218, and the sixth variable shunt inductance circuit 220, and a corresponding one of the first inductance control signal $ICS_1$, the second inductance control signal $ICS_2$, the third inductance control signal $ICS_3$, the fourth inductance control signal $ICS_4$, the fifth inductance control signal $ICS_5$, and the sixth inductance control signal $ICS_6$ are omitted.

In a third exemplary embodiment of the first RF impedance translation circuit 10 illustrated in FIG. 17, two of the first variable shunt inductance circuit 210, the second variable shunt inductance circuit 212, the third variable shunt inductance circuit 214, the fourth variable shunt inductance circuit 216, the fifth variable shunt inductance circuit 218, and the sixth variable shunt inductance circuit 220, and a corresponding two of the first inductance control signal $ICS_1$, the second inductance control signal $ICS_2$, the third inductance control signal $ICS_3$, the fourth inductance control signal $ICS_4$, the fifth inductance control signal $ICS_5$, and the sixth inductance control signal $ICS_6$ are omitted.

In a fourth exemplary embodiment of the first RF impedance translation circuit 10 illustrated in FIG. 17, three of the first variable shunt inductance circuit 210, the second variable shunt inductance circuit 212, the third variable shunt inductance circuit 214, the fourth variable shunt inductance circuit 216, the fifth variable shunt inductance circuit 218, and the sixth variable shunt inductance circuit 220, and a corresponding three of the first inductance control signal $ICS_1$, the second inductance control signal $ICS_2$, the third inductance control signal $ICS_3$, the fourth inductance control signal $ICS_4$, the fifth inductance control signal $ICS_5$, and the sixth inductance control signal $ICS_6$ are omitted.

In a fifth exemplary embodiment of the first RF impedance translation circuit 10 illustrated in FIG. 17, four of the first variable shunt inductance circuit 210, the second variable shunt inductance circuit 212, the third variable shunt inductance circuit 214, the fourth variable shunt inductance circuit 216, the fifth variable shunt inductance circuit 218, and the sixth variable shunt inductance circuit 220, and a corresponding four of the first inductance control signal $ICS_1$, the second inductance control signal $ICS_2$, the third inductance control signal $ICS_3$, the fourth inductance control signal $ICS_4$, the fifth inductance control signal $ICS_5$, and the sixth inductance control signal $ICS_6$ are omitted.

In a sixth exemplary embodiment of the first RF impedance translation circuit 10 illustrated in FIG. 17, five of the first variable shunt inductance circuit 210, the second variable shunt inductance circuit 212, the third variable shunt inductance circuit 214, the fourth variable shunt inductance circuit 216, the fifth variable shunt inductance circuit 218, and the sixth variable shunt inductance circuit 220, and a corresponding five of the first inductance control signal $ICS_1$, the second inductance control signal $ICS_2$, the third inductance control signal $ICS_3$, the fourth inductance control signal $ICS_4$, the fifth inductance control signal $ICS_5$, and the sixth inductance control signal $ICS_6$ are omitted. In one embodiment of the first RF impedance translation circuit 10 illustrated in FIG. 17, the common reference CREF is ground.

In other embodiments of the first RF impedance translation circuit 10 illustrated in any or all of FIGS. 2, 4, 12A, 12B, 13, 14, 15, 16, and 18, any or all of the inductive elements may be replaced with capacitive elements, any or all of the variable shunt capacitance circuits may be replaced with variable shunt inductance circuits, and any or all of the capacitance control signals may be replaced with inductance control signals. Furthermore, any or all of the capacitive elements may be variable capacitive elements, which may be similar to any or all of the variable shunt capacitance circuits illustrated in FIGS. 5, 9, 10, and 11. Any or all of the variable shunt inductance circuits may use techniques that are similar to any or all of the variable shunt capacitance circuits illustrated in FIGS. 5, 9, and 10.

Figure 18:
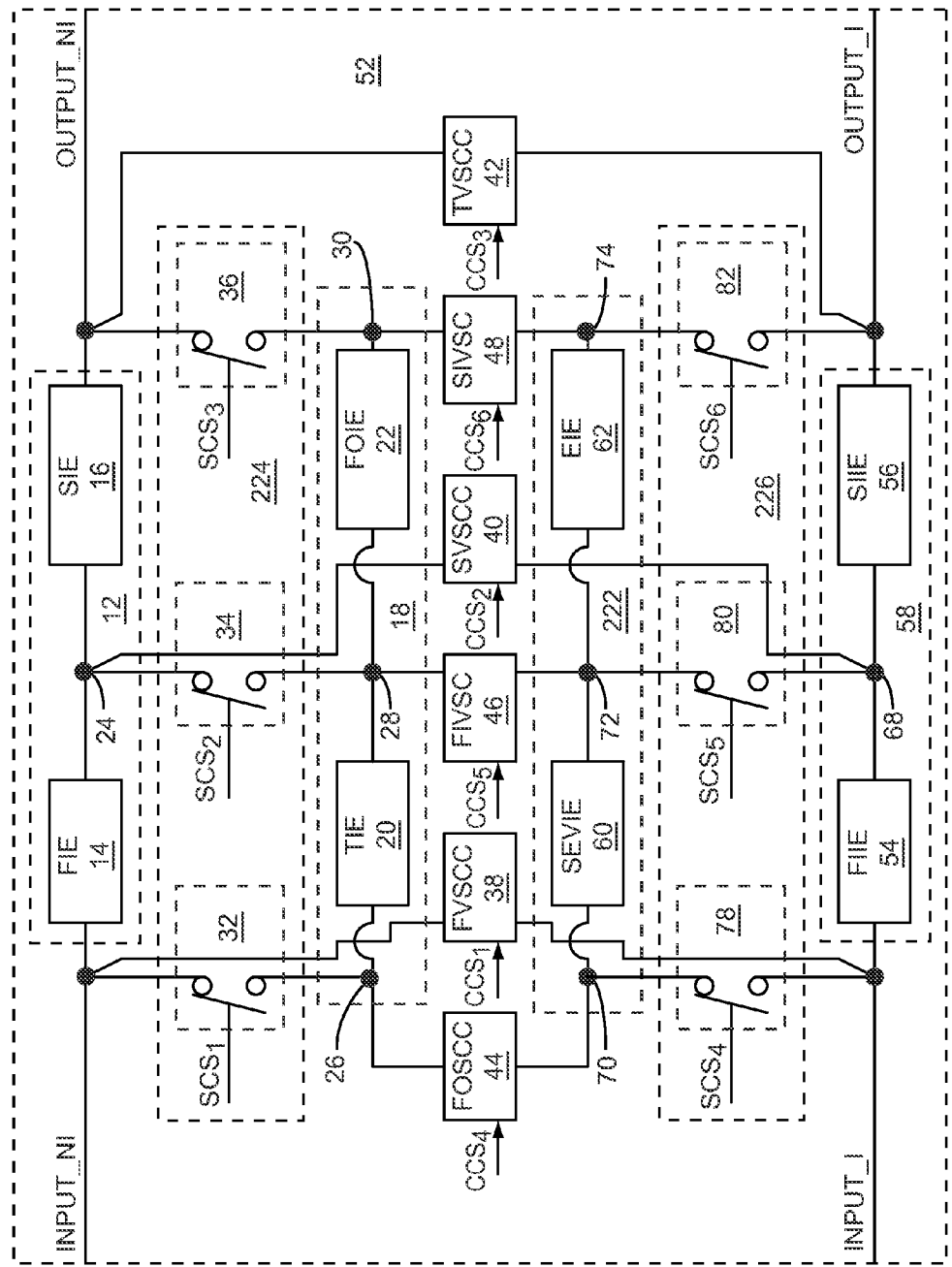
FIG. 18 shows the first portion 52 of the first RF impedance translation circuit according to an alternative embodiment of the first RF impedance translation circuit.

FIG. 18 shows the first portion 52 of the first RF impedance translation circuit 10 according to an alternative embodiment of the first RF impedance translation circuit 10. The first RF impedance translation circuit 10 illustrated in FIG. 18 is similar to the first RF impedance translation circuit 10 illustrated in FIG. 1, except the first RF impedance translation circuit 10 illustrated in FIG. 18 includes differential inputs and differential outputs for receiving and providing differential input signals and differential output signals, respectively.

Specifically, the first RF impedance translation circuit 10 includes the first group 12 of inductive elements, which includes the first inductive element 14 and the second inductive element 16, the second group 18 of inductive elements, which includes the third inductive element 20 and the fourth inductive element 22, the third group 58 if inductive elements, which includes the fifth inductive element 54 and the sixth inductive element 56, and a fourth group 222 of inductive elements, which includes the seventh inductive element 60 and the eighth inductive element 62. The first group 12 of inductive elements is cascaded in series between a non-inverting input INPUT_NI and a non-inverting output OUTPUT_NI using the first connection node 24, such that the first inductive element 14 is electrically coupled between the non-inverting input INPUT_NI and the first connection node 24, and the second inductive element 16 is electrically coupled between the non-inverting output OUTPUT_NI and the first connection node 24. The second group 18 of inductive elements is cascaded in series using multiple connection nodes, such that the third inductive element 20 is electrically coupled between the second connection node 26 and the third connection node 28, and the fourth inductive element 22 is electrically coupled between the fourth connection node 30 and the third connection node 28.

The third group 58 of inductive elements is cascaded in series between an inverting input INPUT_I and an inverting output OUTPUT_I using the fifth connection node 66, such that the fifth inductive element 54 is electrically coupled between the inverting input INPUT_I and the fifth connection node 66, and the sixth inductive element 56 is electrically coupled between the inverting output OUTPUT_I and the fifth connection node 58. The fourth group 222 of inductive elements is cascaded in series using multiple connection nodes, such that the seventh inductive element 60 is electrically coupled between the sixth connection node 68 and the seventh connection node 70, and the eighth inductive element 62 is electrically coupled between the eighth connection node 72 and the seventh connection node 70. The first RF impedance translation circuit 10 includes a first switching group 224 of switching elements that are capable of electrically coupling the first group 12 of inductive elements to the second group 18 of inductive elements, and a second switching group 226 of switching elements that are capable of electrically coupling the third group 58 of inductive elements to the fourth group 222 of inductive elements. The first switching group 224 includes the first, the second, and the third switching elements 32, 34, 36 and the second switching group 226 includes the fourth, the fifth, and the sixth switching elements 78, 80, 82. Specifically, the first switching element 32 is electrically coupled between the second connection node 26 and the non-inverting input INPUT_NI, the second switching element 34 is electrically coupled between the first connection node 24 and the third connection node 28, and the third switching element 36 is electrically coupled between the fourth connection node 30 and the non-inverting output OUTPUT_NI. The fourth switching element 78 is electrically coupled between the sixth connection node 68 and the inverting input INPUT_I, the fifth switching element 80 is electrically coupled between the fifth connection node 66 and the seventh connection node 70, and the sixth switching element 82 is electrically coupled between the eighth connection node 72 and the inverting output OUTPUT_I.

Further, the first RF impedance translation circuit 10 includes at least one variable shunt capacitance circuit electrically coupled between connection nodes in the first RF impedance translation circuit 10. Specifically, the first RF impedance translation circuit 10 includes the first variable shunt capacitance circuit 38 electrically coupled between the non-inverting input INPUT_NI and the inverting input INPUT_I, the second variable shunt capacitance circuit 40 electrically coupled between the fifth connection node 66 and the first connection node 24, the third variable shunt capacitance circuit 42 electrically coupled between the non-inverting output OUTPUT_NI and the inverting output OUTPUT_I, the fourth variable shunt capacitance circuit 44 electrically coupled between the sixth connection node 68 and the second connection node 26, the fifth variable shunt capacitance circuit 46 electrically coupled between the seventh connection node 70 and the third connection node 28, and the sixth variable shunt capacitance circuit 48 electrically coupled between the eighth connection node 72 and the fourth connection node 30.

Additionally, the first RF impedance translation circuit 10 includes control circuitry 50 (FIG. 3), which provides the first switch control signal $SCS_1$ to the first switching element 32, the second switch control signal $SCS_2$ to the second switching element 34, the third switch control signal $SCS_3$ to the third switching element 36, fourth switch control signal $SCS_4$ to the fourth switching element 78, the fifth switch control signal $SCS_5$ to the fifth switching element 80, the sixth switch control signal $SCS_6$ to the sixth switching element 82, the first capacitance control signal $CCS_1$ to the first variable shunt capacitance circuit 38, the second capacitance control signal $CCS_2$ to the second variable shunt capacitance circuit 40, the third capacitance control signal $CCS_3$ to the third variable shunt capacitance circuit 42, the fourth capacitance control signal $CCS_4$ to the fourth variable shunt capacitance circuit 44, the fifth capacitance control signal $CCS_5$ to the fifth variable shunt capacitance circuit 46, and the sixth capacitance control signal $CCS_6$ to the sixth variable shunt capacitance circuit 48.

By providing the appropriate first switch control signal $SCS_1$, second switch control signal $SCS_2$, third switch control signal $SCS_3$, fourth switch control signal $SCS_4$, fifth switch control signal $SCS_5$, and sixth switch control signal $SCS_6$, the control circuitry 50 may select either an OFF state or an ON state associated with each of the first switching element 32, the second switching element 34, the third switching element 36, the fourth switching element 78, the fifth switching element 80, and the sixth switching element 82, respectively. When each ON state is selected, the first switching element 32 electrically couples the second connection node 26 to the non-inverting input INPUT_NI, the second switching element 34 electrically couples the first connection node 24 to the third connection node 28, the third switching element 36 electrically couples the fourth connection node 30 to the non-inverting output OUTPUT_NI, the fourth switching element 78 electrically couples the sixth connection node 68 to the inverting input INPUT_N, the fifth switching element 80 electrically couples the fifth connection node 66 to the seventh connection node 70, and the sixth switching element 82 electrically couples the eighth connection node 72 to the inverting output OUTPUT_I.

When each OFF state is selected, the first switching element 32 does not intentionally provide a conduction path between the second connection node 26 and the non-inverting input INPUT_NI, the second switching element 34 does not intentionally provide a conduction path between the first connection node 24 and the third connection node 28, the third switching element 36 does not intentionally provide a conduction path between the fourth connection node 30 and the non-inverting output OUTPUT_NI, the fourth switching element 78 does not intentionally provide a conduction path between the sixth connection node 68 and the inverting input INPUT_I, the fifth switching element 80 does not intentionally provide a conduction path between the fifth connection node 66 and the seventh connection node 70, and the sixth switching element 82 does not intentionally provide a conduction path between the eighth connection node 72 and the inverting output OUTPUT_I.

By providing the appropriate first capacitance control signal $CCS_1$, second capacitance control signal $CCS_2$, third capacitance control signal $CCS_3$, fourth capacitance control signal $CCS_4$, fifth capacitance control signal $CCS_5$, and sixth capacitance control signal $CCS_6$, the control circuitry 50 may select a desired capacitance associated with each of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, and the sixth variable shunt capacitance circuit 48, respectively.

The first variable shunt capacitance circuit 38 presents a selected capacitance between the non-inverting input INPUT_NI and the inverting input INPUT_I, the second variable shunt capacitance circuit 40 presents a selected capacitance between the fifth connection node 66 and the first connection node 24, the third variable shunt capacitance circuit 42 presents a selected capacitance between the non-inverting output OUTPUT_NI and the inverting output INPUT_I, the fourth variable shunt capacitance circuit 44 presents a selected capacitance between the sixth connection node 68 and the second connection node 26, the fifth variable shunt capacitance circuit 46 presents a selected capacitance between the seventh connection node 70 and the third connection node 28, and the sixth variable shunt capacitance circuit 48 presents a selected capacitance between the eighth connection node 72 and the fourth connection node 30.

A first impedance presented to and between the non-inverting output OUTPUT_NI and the inverting output OUTPUT_I may be translated into a second impedance presented at and between the non-inverting input INPUT_NI and the inverting input INPUT_I based on the selected capacitances associated with each of the first, the second, the third, the fourth, the fifth, and the sixth variable shunt capacitance circuits 38, 40, 42, 44, 46, 48 and the switching states of the first, the second, the third, the fourth, the fifth, and the sixth switching elements 32, 34, 36, 78, 80, 82. Further, impedance translation characteristics of the first RF impedance translation circuit 10 may be based on the selected capacitances associated with each of the first, the second, the third, the fourth, the fifth, and the sixth variable shunt capacitance circuits 38, 40, 42, 44, 46, 48 and the switching states of the first, the second, the third, the fourth, the fifth, and the sixth switching elements 32, 34, 36, 78, 80, 82. In general, the impedance translation characteristics of the first RF impedance translation circuit 10 may be based on each capacitance control signal and on each switch control signal, and the first impedance presented to and between the non-inverting output OUTPUT_NI and the inverting output OUTPUT_I may be translated into the second impedance presented at and between the non-inverting input INPUT_NI and the inverting input INPUT_I based on each capacitance control signal and on each switch control signal.

In a first exemplary embodiment of the first RF impedance translation circuit 10 illustrated in FIG. 18, one of the first switching element 32, the second switching element 34, the third switching element 36, the fourth switching element 78, the fifth switching element 80, and the sixth switching element 82, and a corresponding one of the first switch control signal $SCS_1$, the second switch control signal $SCS_2$, the third switch control signal $SCS_3$, the fourth switch control signal $SCS_4$, the fifth switch control signal $SCS_5$, and the sixth switch control signal $SCS_6$, are omitted.

In a second exemplary embodiment of the first RF impedance translation circuit 10 illustrated in FIG. 18, two of the first switching element 32, the second switching element 34, the third switching element 36, the fourth switching element 78, the fifth switching element 80, and the sixth switching element 82, and a corresponding two of the first switch control signal $SCS_1$, the second switch control signal $SCS_2$, the third switch control signal $SCS_3$, the fourth switch control signal $SCS_4$, the fifth switch control signal $SCS_5$, and the sixth switch control signal $SCS_6$, are omitted.

In a third exemplary embodiment of the first RF impedance translation circuit 10 illustrated in FIG. 18, three of the first switching element 32, the second switching element 34, the third switching element 36, the fourth switching element 78, the fifth switching element 80, and the sixth switching element 82, and a corresponding three of the first switch control signal $SCS_1$, the second switch control signal $SCS_2$, the third switch control signal $SCS_3$, the fourth switch control signal $SCS_4$, the fifth switch control signal $SCS_5$, and the sixth switch control signal $SCS_6$, are omitted.

In a fourth exemplary embodiment of the first RF impedance translation circuit 10 illustrated in FIG. 18, four of the first switching element 32, the second switching element 34, the third switching element 36, the fourth switching element 78, the fifth switching element 80, and the sixth switching element 82, and a corresponding four of the first switch control signal $SCS_1$, the second switch control signal $SCS_2$, the third switch control signal $SCS_3$, the fourth switch control signal $SCS_4$, the fifth switch control signal $SCS_5$, and the sixth switch control signal $SCS_6$, are omitted.

In a fifth exemplary embodiment of the first RF impedance translation circuit 10 illustrated in FIG. 18, one of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, and the sixth variable shunt capacitance circuit 48, and a corresponding one of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, and the sixth capacitance control signal $CCS_6$ are omitted.

In a sixth exemplary embodiment of the first RF impedance translation circuit 10 illustrated in FIG. 18, two of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, and the sixth variable shunt capacitance circuit 48, and a corresponding two of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, and the sixth capacitance control signal $CCS_6$ are omitted.

In a seventh exemplary embodiment of the first RF impedance translation circuit 10 illustrated in FIG. 18, three of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, and the sixth variable shunt capacitance circuit 48, and a corresponding three of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, and the sixth capacitance control signal $CCS_6$ are omitted.

In a eighth exemplary embodiment of the first RF impedance translation circuit 10 illustrated in FIG. 18, four of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, and the sixth variable shunt capacitance circuit 48, and a corresponding four of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, and the sixth capacitance control signal $CCS_6$ are omitted.

In a ninth exemplary embodiment of the first RF impedance translation circuit 10 illustrated in FIG. 18, five of the first variable shunt capacitance circuit 38, the second variable shunt capacitance circuit 40, the third variable shunt capacitance circuit 42, the fourth variable shunt capacitance circuit 44, the fifth variable shunt capacitance circuit 46, and the sixth variable shunt capacitance circuit 48, and a corresponding five of the first capacitance control signal $CCS_1$, the second capacitance control signal $CCS_2$, the third capacitance control signal $CCS_3$, the fourth capacitance control signal $CCS_4$, the fifth capacitance control signal $CCS_5$, and the sixth capacitance control signal $CCS_6$ are omitted.

In other embodiments of the first RF impedance translation circuit 10 illustrated in any or all of FIGS. 2, 4, 12A, 12B, 13, 14, 15, 16, and 17, differential circuitry, which is similar to the differential circuitry illustrated in FIG. 18, may be used instead of the single-ended circuitry illustrated in any or all of FIGS. 2, 4, 12A, 12B, 13, 14, 15, 16, and 17.

In one embodiment of the first RF impedance translation circuit 10 illustrated in any or all of FIGS. 2, 4, 12A, 12B, 13, 14, 15, 16, 17, and 18, any or all of the first switching element 32, the second switching element 34, the third switching element 36, the fourth switching element 78, the fifth switching element 80, the sixth switching element 82, the seventh switching element 84, and the eighth switching element 84, may include a solid state switching device, such as any type of bipolar transistor element, any type of field effect transistor (FET) element, such as a pseudomorphic high electron mobility transistor (pHEMT) element, any type of switching diode element, such as a P-type material-intrinsic material-N-type material (PIN) diode, any type of silicon-on-insulator (SOI) switching element, or the like, or an type of electro-mechanical switching device, such as a relay, a micro-electromechanicalsystems (MEMS) contact switch, or the like.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. Any computing hardware may include mainframes, micro-processors, micro-controllers, DSPs, the like, or any combination thereof.

None of the embodiments of the present invention are intended to limit the scope of any other embodiment of the present invention. Any or all of any embodiment of the present invention may be combined with any or all of any other embodiment of the present invention to create new embodiments of the present invention.

Those skilled in the art will recognize improvements and modifications to the preferred embodiments of the present invention. All such improvements and modifications are considered within the scope of the concepts disclosed herein and the claims that follow.

What is claimed is:

1. A first radio frequency (RF) impedance translation circuit comprising:
    a first plurality of inductive elements cascaded in series without any series switching elements between an input and an output using at least a first of a plurality of connection nodes;
    a second plurality of inductive elements cascaded in series using the plurality of connection nodes;
    a first plurality of switching elements, such that:
        a first of the first plurality of switching elements is coupled between a second of the plurality of connection nodes and one selected from a group consisting of the input, the output, and the first of the plurality of connection nodes;
        a second of the first plurality of switching elements is coupled between a third of the plurality of connection nodes and another selected from the group consisting of the input, the output, and the first of the plurality of connection nodes; and
        each of the first plurality of switching elements has one of an OFF state and an ON state based on a switch control signal;
    at least one variable shunt capacitance circuit, such that each variable shunt capacitance circuit:
        is coupled between a common reference and a corresponding one selected from a group consisting of the input, the output, and the plurality of connection nodes; and
        has a capacitance based on a capacitance control signal; and
    control circuitry adapted to provide each capacitance control signal to a corresponding each variable shunt capacitance circuit and each switch control signal to a corresponding each of the first plurality of switching elements; and
    a common power amplifier having a first output power level and a first output impedance and a second output power level and a second output impedance wherein the second output power level is greater than the first output power level and the second output impedance is less than the first output impedance;
    wherein a first impedance presented to the output is translated into a second impedance presented at the input.

2. The first RF impedance translation circuit of claim 1 wherein the input is adapted to receive an RF input signal and the output is adapted to provide an RF output signal based on the RF input signal, wherein impedance translation characteristics of the first RF impedance translation circuit are based on each capacitance control signal and each switch control signal.

3. The first RF impedance translation circuit of claim 2 further comprising at least one plurality of inductive elements cascaded in series using the plurality of connection nodes, such that:
    the first plurality of switching elements further comprises:
        a third switching element coupled between a fourth of the plurality of connection nodes and one selected from the group consisting of the input, the output, and the first of the plurality of connection nodes; and
        a fourth switching element coupled between a fifth of the plurality of connection nodes and another selected from the group consisting of the input, the output, and the first of the plurality of connection nodes; and
    the at least one variable shunt capacitance circuit comprises at least three variable shunt capacitance circuits.

4. The first RF impedance translation circuit of claim 2 wherein:
    the first plurality of inductive elements comprises at least three inductive elements cascaded in series without any series switching elements between the input and the output using at least the first of the plurality of connection nodes and a fourth of the plurality of connection nodes;
    the second plurality of inductive elements comprises at least three inductive elements cascaded in series using the plurality of connection nodes;
    the first plurality of switching elements further comprises a third switching element coupled between a fifth of the plurality of connection nodes and one selected from a group consisting of the input, the output, the first of the plurality of connection nodes, and the fourth of the plurality of connection nodes; and
    the at least one variable shunt capacitance circuit comprises at least three variable shunt capacitance circuits.

5. The first RF impedance translation circuit of claim 2 wherein:
    each of at least one of the first plurality of inductive elements comprises a transmission line segment; and
    each of at least one of the second plurality of inductive elements comprises a transmission line segment.

6. The first RF impedance translation circuit of claim 2 wherein:
    each of at least one of the first plurality of inductive elements comprises a spiral transmission line segment; and each of at least one of the second plurality of inductive elements comprises a spiral transmission line segment.

7. The first RF impedance translation circuit of claim 2 wherein:
each of at least one of the first plurality of inductive elements comprises a spiral printed circuit board (PCB) trace; and
each of at least one of the second plurality of inductive elements comprises a spiral PCB trace.

8. The first RF impedance translation circuit of claim 2 wherein one of the at least one variable shunt capacitance circuit comprises a varactor diode, which provides capacitance based on a direct current (DC) bias voltage, which is based on a corresponding capacitance control signal.

9. The first RF impedance translation circuit of claim 2 wherein one of the at least one variable shunt capacitance circuit comprises at least one switched capacitive element, such that each switched capacitive element has one of an OFF state and an ON state based on a corresponding capacitance control signal.

10. The first RF impedance translation circuit of claim 2 wherein the common reference is ground.

11. The first RF impedance translation circuit of claim 2 adapted to:
operate in one of a first operating mode and a second operating mode; and
operate using a first RF communications band during the first operating mode and operate using a second RF communications band during the second operating mode.

12. The first RF impedance translation circuit of claim 11 wherein:
the first RF communications band has a first center frequency; and
the second RF communications band has a second center frequency, such that a ratio of the first center frequency to the second center frequency is greater than two.

13. The first RF impedance translation circuit of claim 11 wherein the common power amplifier is adapted to provide the RF input signal.

14. The first RF impedance translation circuit of claim 13 wherein the common power amplifier comprises a plurality of segmented output stages coupled in parallel, such that:
when at least one of the segmented output stages is in a DISABLED state, the common power amplifier has a first output power level and a first output impedance; and
when the at least one of the segmented output stages is in an ENABLED state, the common power amplifier has a second output power level and a second output impedance,
wherein the second output power level is greater than the first output power level and the second output impedance is less than the first output impedance.

15. The first RF impedance translation circuit of claim 14 wherein when the at least one of the segmented output stages is in the DISABLED state, the second impedance is about matched to the first output impedance and when the at least one of the segmented output stages is in the ENABLED state, the second impedance is about matched to the second output impedance.

16. The first RF impedance translation circuit of claim 13 wherein an RF antenna is adapted to receive the RF output signal, such that the first impedance is based on the RF antenna.

17. The first RF impedance translation circuit of claim 2 wherein an RF antenna is adapted to receive the RF output signal, such that the first impedance is based on the RF antenna.

18. The first RF impedance translation circuit of claim 17 wherein:
when the RF antenna has a voltage standing wave ratio (VSWR) of about one-to-one, the second impedance has a first magnitude; and
when the RF antenna has a VSWR of about four-to-one, the second impedance has a second magnitude, which is about equal to the first magnitude.

19. A radio frequency (RF) impedance translation circuit comprising:
a first plurality of inductive elements cascaded in series without any series switching elements between a first input and a first output using at least a first of a first plurality of connection nodes;
a second plurality of inductive elements cascaded in series using the first plurality of connection nodes;
a third plurality of inductive elements cascaded in series without any series switching elements between a second input and a second output using at least a first of a second plurality of connection nodes;
a fourth plurality of inductive elements cascaded in series using the second plurality of connection nodes;
a first plurality of switching elements, such that:
a first of the first plurality of switching elements is coupled between a second of the first plurality of connection nodes and one selected from a group consisting of the first input, the first output, and the first of the first plurality of connection nodes;
a second of the first plurality of switching elements is coupled between a third of the first plurality of connection nodes and another selected from the group consisting of the first input, the first output, and the first of the first plurality of connection nodes; and
each of the first plurality of switching elements has one of an OFF state and an ON state based on a switch control signal;
a second plurality of switching elements, such that:
a first of the second plurality of switching elements is coupled between a second of the second plurality of connection nodes and one selected from a group consisting of the second input, the second output, and the first of the second plurality of connection nodes;
a second of the second plurality of switching elements is coupled between a third of the second plurality of connection nodes and another selected from the group consisting of the second input, the second output, and the first of the second plurality of connection nodes; and
each of the second plurality of switching elements has one of an OFF state and an ON state based on a switch control signal;
at least one variable shunt capacitance circuit, such that each variable shunt capacitance circuit:
is coupled between a corresponding one selected from a first group consisting of the first input, the first output, and the first plurality of connection nodes, and a corresponding one selected from a second group consisting of the second input, the second output, and the second plurality of connection nodes; and
has a capacitance based on a capacitance control signal; and
control circuitry adapted to provide each capacitance control signal to a corresponding each variable shunt capacitance circuit and each switch control signal to a corresponding each of the first plurality of switching elements or each of the second plurality of switching elements, to provide impedance translation characteristics of the RF impedance translation circuit, wherein a first impedance presented between the first output and the second output is translated into a second impedance presented between the first input and the second input.

* * * * *